(12) United States Patent
Ko et al.

(10) Patent No.: US 11,901,191 B2
(45) Date of Patent: Feb. 13, 2024

(54) ATOMIC LAYER ETCHING METHOD AND SEMICONDUCTOR DEVICE MANUFACTURING METHOD USING THE SAME

(71) Applicant: SAMSUNG ELECTRONICS CO., LTD., Suwon-si (KR)

(72) Inventors: Eun Hyea Ko, Suwon-si (KR); Hee Yeon Jeong, Jecheon-si (KR); Jun Hee Cho, Daejeon (KR); Gyu-Hee Park, Hwaseong-si (KR); Joong Jin Park, Daejeon (KR); Byeong Il Yang, Daejeong (KR); Youn Joung Cho, Hwaseong-si (KR); Ji Yu Choi, Hwaseong-si (KR)

(73) Assignees: Samsung Electronics Co., Ltd. (KR); DNF Co., Ltd. (KR)

( * ) Notice: Subject to any disclaimer, the term of this patent is extended or adjusted under 35 U.S.C. 154(b) by 103 days.

(21) Appl. No.: 17/535,933

(22) Filed: Nov. 26, 2021

(65) Prior Publication Data
US 2022/0375760 A1    Nov. 24, 2022

(30) Foreign Application Priority Data

May 10, 2021    (KR) .......................... 10-2021-0060066

(51) Int. Cl.
*H01L 21/311* (2006.01)
(52) U.S. Cl.
CPC .............................. *H01L 21/31116* (2013.01)
(58) Field of Classification Search
None
See application file for complete search history.

(56) References Cited

U.S. PATENT DOCUMENTS 9,309,598 B2 *  4/2016  Wang ................ H01J 37/32091
10,163,696 B2   12/2018  Wang et al.
(Continued)

FOREIGN PATENT DOCUMENTS

JP    H08253881 A    10/1996
JP    2677321 B9     11/1997
(Continued)

*Primary Examiner* — Stephanie P Duclair
(74) *Attorney, Agent, or Firm* — Fish & Richardson P.C.

(57) ABSTRACT

An atomic layer etching method capable of precisely etching a metal thin film at units of atomic layer from a substrate including the metal thin film, includes forming a metal layer on a substrate, and etching at least a portion of the metal layer. The etching at least a portion of the metal layer includes at least one etching cycle. The at least one etching cycle includes supplying an active gas onto the metal layer, and supplying an etching support gas after supplying the active gas. The etching support gas is expressed by the following general formula

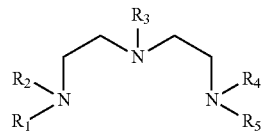

wherein each of R1, R2, R3, R4 and R5 independently includes hydrogen or a $C_1$-$C_4$ alkyl group, and N is nitrogen.

19 Claims, 30 Drawing Sheets

(56) References Cited

U.S. PATENT DOCUMENTS

| | | |
|---|---|---|
| 10,199,268 B2 | 2/2019 | Yamauchi et al. |
| 10,573,527 B2 | 2/2020 | Bajaj et al. |
| 10,784,086 B2 | 9/2020 | Yang et al. |
| 2020/0321220 A1 | 10/2020 | Papalia et al. |
| 2020/0339523 A1 | 10/2020 | Hoogboom et al. |

FOREIGN PATENT DOCUMENTS

| | | |
|---|---|---|
| JP | H1088373 A | 4/1998 |
| JP | 2007051200 A | 3/2007 |
| KR | 0259609 B1 | 3/1998 |
| KR | 1766190 B1 | 11/2015 |
| KR | 1851764 B1 | 8/2017 |
| WO | 14159888 A1 | 10/2014 |

\* cited by examiner

ATOMIC LAYER ETCHING METHOD AND SEMICONDUCTOR DEVICE MANUFACTURING METHOD USING THE SAME

CROSS-REFERENCE TO RELATED APPLICATION

A claim of priority under 35 U.S.C. § 119 is made to Korean Patent Application No. 10-2021-0060066 filed on May 10, 2021 in the Korean Intellectual Property Office, the entirety of which is hereby incorporated by reference.

BACKGROUND

The present disclosure relates to atomic layer etching methods and semiconductor device manufacturing methods using the same, and more particularly to methods capable of precisely etching a metal thin film from a substrate including the metal thin film at units of atomic layer.

As technology advances and the need for higher degrees of integration of semiconductor devices increases, highly precise etching processes are required during semiconductor device manufacturing. Processes including atomic layer etching (ALE) capable of performing etching at units of atomic layer are thus required.

Although a variety of wet etching methods for removing cobalt thin film have been proposed, it is difficult to precisely control wet etching. In contrast, studies involving dry etching methods for removing cobalt thin film have not been actively pursued. Therefore, there is currently a need for in-situ dry etching methods capable of accurately controlling etch rate.

BRIEF SUMMARY

Embodiments of the inventive concepts provide an atomic layer etching method capable of precisely etching a metal thin film at units of atomic layer.

Embodiments of the inventive concepts provide a semiconductor device manufacturing method using an atomic layer etching method capable of precisely etching a metal thin film at units of atomic layer.

Embodiments of the inventive concepts provide an atomic layer etching method including forming a metal layer on a substrate; and etching at least a portion of the metal layer. The etching at least a portion of the metal layer includes at least one etching cycle. The at least one etching cycle includes supplying an active gas onto the metal layer, and supplying an etching support gas after supplying the active gas. The etching support gas is expressed by the following general formula (1),

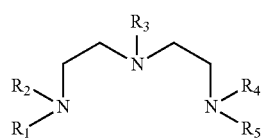

wherein each of R1, R2, R3, R4 and R5 independently includes hydrogen or a $C_1$-$C_4$ alkyl group, and N is nitrogen.

Embodiments of the inventive concepts further provide an atomic layer etching method including forming a metal layer on a substrate; and etching at least a portion of the metal layer. The etching at least a portion of the metal layer includes at least one etching cycle. The at least one etching cycle includes supplying an active gas including a halogen gas onto the metal layer, and supplying an amine based etching support gas after supplying the active gas. The supplying the etching support gas includes supplying the etching support gas at a feeding dosage of 50 Torr·sec to 70 Torr·sec.

Embodiments of the inventive concepts still further provide a semiconductor device manufacturing method including forming an active pattern on a substrate; forming a source/drain pattern on the active pattern; forming an interlayer insulating film on the source/drain pattern; forming a pre-active contact connected with the source/drain pattern, in the interlayer insulating film; and etching a portion of the pre-active contact. The etching a portion of the pre-active contact includes at least one etching cycle. The at least one etching cycle includes supplying an active gas onto the pre-active contact, and supplying an etching support gas after supplying the active gas. The etching support gas is expressed by the following general formula (1),

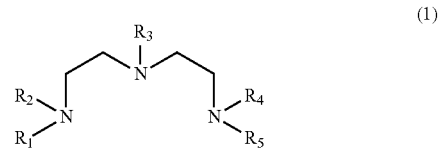

wherein each of R1, R2, R3, R4 and R5 independently includes hydrogen or a $C_1$-$C_4$ alkyl group, and N is nitrogen.

BRIEF DESCRIPTION OF THE DRAWINGS

The above and other aspects and features of the present disclosure will become more apparent in view of the following detailed description of embodiments as made with reference to the attached drawings.

FIGS. 15, 17, 19, 21, 23, 25, 27, 29 and 31 are cross-sectional views taken along line A-A' of FIG. 14, and FIGS. 16, 18, 20, 22, 24, 26, 28, 30 and 32 are cross-sectional views taken along line B-B' of FIG. 14.

DETAILED DESCRIPTION

Figure 1:
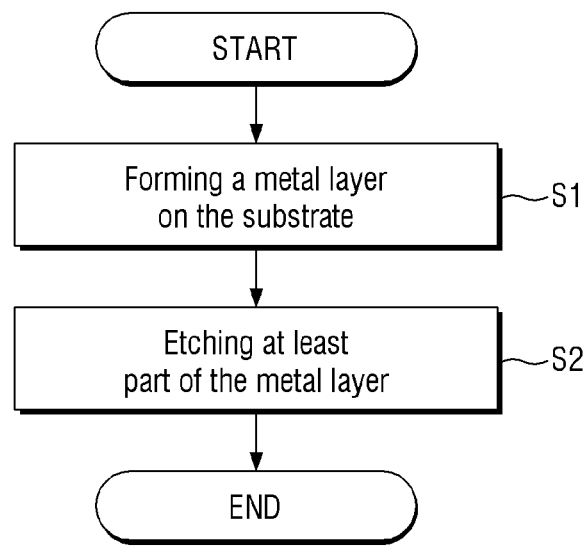
FIG. 1 illustrates a flow chart descriptive of an atomic layer etching method according to embodiments of the inventive concepts.

Hereinafter, embodiments of the inventive concepts will be described in detail with reference to the accompanying drawings. Herein, like reference numerals will denote like elements, and redundant descriptions thereof will be omitted for conciseness. Throughout the description, relative locations of components may be described using such terms as "vertical", "horizontal", "over", "higher" and so on. These terms are for descriptive purposes only, and are intended only to describe the relative locations of components assuming the orientation of the overall device is the same as that shown in the drawings. The embodiments however are not limited to the illustrated device orientations.

With the higher degree of semiconductor device integration currently demanded, precise etching processes have become increasingly important. Meanwhile, metal thin film materials including various transition metals such as for example aluminum, cobalt, and tungsten have been proposed to improve characteristics and performance of semiconductor devices.

In order to provide semiconductor devices having improved reliability, precise dimensional accuracy based on etching of metal thin film is firstly required. Secondly, defects that degrade characteristics of semiconductor devices and re-adsorption induced from unnecessary reaction byproducts should be avoided.

As will hereinafter be described, atomic layer etching methods according to embodiments of the inventive concepts are not affected by pressure, and a metal-ligand complex having significantly improved volatility may be formed. It is thus possible to precisely etch metal thin film even under low temperature process conditions according to embodiments of the inventive concepts.

Figure 2:
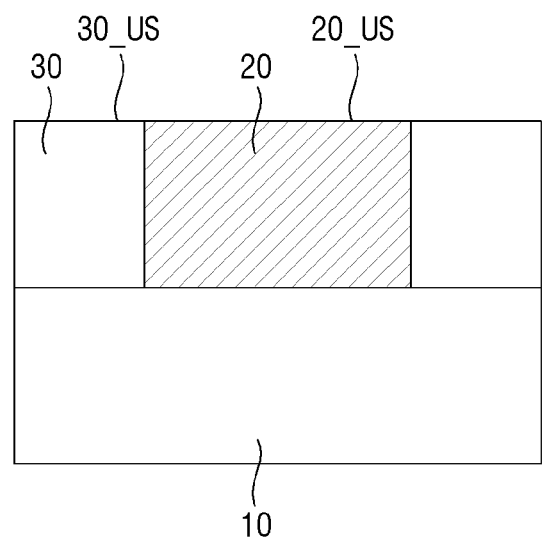
FIG. 2 illustrates an exemplary cross-sectional view descriptive of step S1 of FIG. 1.

FIG. 1 illustrates a flow chart descriptive of an atomic layer etching method according to embodiments of the inventive concepts. FIG. 2 illustrates an exemplary cross-sectional view descriptive of step S1 of FIG. 1.

Referring to FIGS. 1 and 2, the atomic layer etching method according to some embodiments of the inventive concepts includes forming a metal layer on a substrate (S1) and etching at least a portion of the metal layer (S2).

Forming the metal layer on the substrate (S1) may for example include providing a first substrate 10 as shown in FIG. 2. The temperature of the first substrate 10 may be in a range from 150° C. to 250° C. For example, the temperature of the first substrate 10 may be 175° C. As another example, the temperature of the first substrate 10 may be 200° C. However, embodiments of the inventive concepts are not limited to these examples.

The first substrate 10 may be a silicon substrate or a silicon-on-insulator (SOI) substrate. In other embodiments, the first substrate 10 may for example include silicon germanium, silicon germanium on insulator (SGOI), indium antimonide, lead telluride compound, indium arsenide, indium phosphide, gallium arsenide or gallium antimonide. In still further embodiments, the first substrate 10 may for example include an organic insulating material or an inorganic insulating material. The first substrate 10 may for example include at least one of silicon oxide (SiO), silicon nitride (SiN), silicon oxynitride (SiON), black diamond, fluoro silicate glass (FSG), silicon oxycarbide (SiOC), polyimide, hydrogen silsesquioxane (HSQ), poly arylene ether (PAE), benzocyclo butene (BCB), fluorinated polyimide (FPI), amorphous fluorocarbon (α-C:F), parylene, or nanoporous silica. However, embodiments of the inventive concepts are not limited to these examples.

A metal layer 20 is formed on the first substrate 10 (S1). Although the metal layer 20 is shown as directly formed on the first substrate 10, this is only for convenience of description. In some embodiments, an insulating material may be formed between the first substrate 10 and the metal layer 20, and a plurality of different metal layers may be formed. The metal layer 20 may for example include, but is not limited to, at least one of iridium (Ir), ruthenium (Ru), rhodium (Rh), molybdenum (Mo), copper (Cu), antimony (Sb), aluminum (Al), titanium (Ti), nickel (Ni), tantalum (Ta), zirconium (Zr), hafnium (Hf), tungsten (W), or cobalt (Co).

An insulating layer 30 is formed on the first substrate 10. The insulating layer 30 may be formed around the metal layer 20. Although the insulating layer 30 is shown as directly formed on the first substrate 10, this is only for convenience of description. A plurality of wires or a plurality of insulating layers may be formed between the first substrate 10 and the insulating layer 30. For example, the insulating layer 30 may include, but is not limited to, at least one of silicon nitride, silicon oxycarbide (SiOC), or silicon oxide (SiO).

An upper surface 20_US of the metal layer 20 and an upper surface 30_US of the insulating layer 30 may be positioned on the same plane. However, this is only for convenience of description, and it should be understood that the upper surface 20_US of the metal layer 20 and the upper surface 30_US of the insulating layer 30 may be positioned on different respective planes.

Subsequently, at least a portion or part of the metal layer 20 is etched (S2). The etching of at least a portion of the metal layer 20 will be described in more detail with reference to FIGS. 3 to 13.

Figure 3:
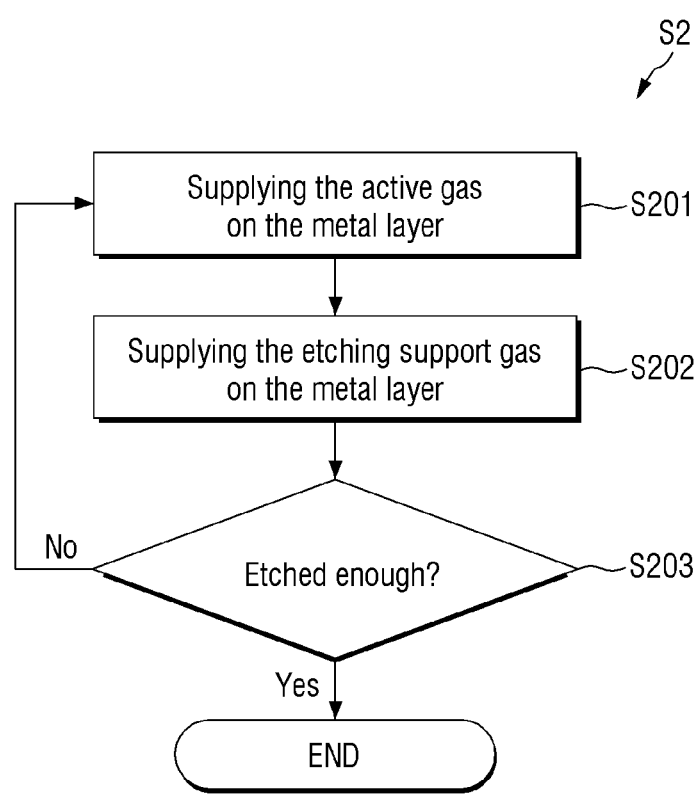
FIG. 3 illustrates a flow chart descriptive of step S2 of FIG. 1.
Figure 4:
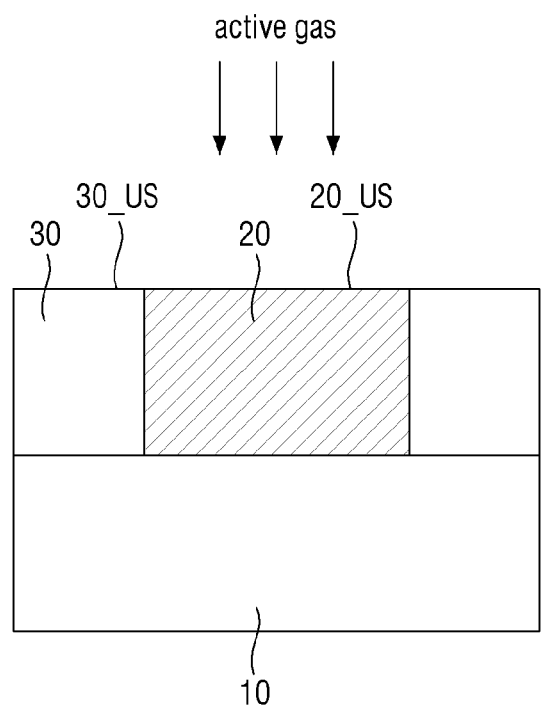
FIG. 4 illustrates an exemplary cross-sectional view descriptive of step S201 of FIG. 3.
Figure 5:
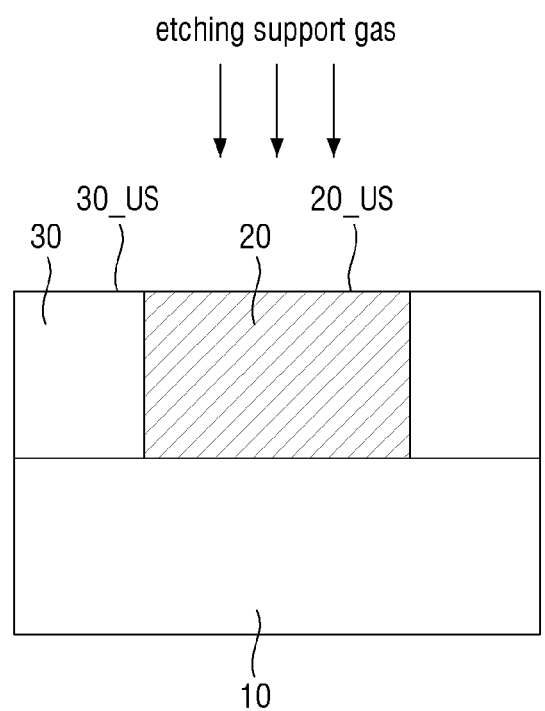
FIG. 5 illustrates an exemplary cross-sectional view descriptive of step S202 of FIG. 3.

FIG. 3 illustrates a flow chart descriptive of step S2 of FIG. 1. FIG. 4 illustrates an exemplary cross-sectional view descriptive of a step S201 of FIG. 3. FIG. 5 illustrates an exemplary cross-sectional view descriptive of step S202 of FIG. 3. Step S2 of FIG. 1 will be hereinafter described in detail with reference to FIGS. 3 to 5.

Referring to FIG. 1 and FIGS. 3 to 5, the etching of at least a portion of the metal layer (S2) includes supplying an active gas onto the metal layer (S201), and supplying an etching support gas onto the metal layer (S202).

The etching of at least a portion of the metal layer (S2) may include at least one etching cycle. Each etching cycle includes, for example, supplying an active gas onto the metal layer (S201), and supplying an etching support gas onto the metal layer (S202). When the metal layer 20 is etched as much as desired or in other words is etched a desired thickness (Yes in S203), the etching of at least a portion of the metal layer (S2) is terminated. On the other hand, when the metal layer 20 is not etched as desired or in other words is not etched a desired thickness (No in S203), the etching cycle may be repeated. That is, the etching of at least a portion of the metal layer (S2) may be performed by repeatedly first supplying an active gas onto the metal layer (S201) and secondly supplying an etching support gas onto the metal layer (S202).

The supplying of an active gas onto the metal layer (S201) may include supplying an active gas plasma onto the metal layer 20.

In FIG. 4, the active gas is shown as supplied to the metal layer 20 (S201). The active gas may include a halogen gas. The active gas may include, for example, at least one of fluorine ($F_2$), chlorine ($Cl_2$), bromine ($Br_2$), iodine ($I_2$), $C_{1-7}$ alkyl halide, or tri $C_{1-7}$ alkyl silyl halide. However, embodiments of the inventive concepts are not limited to this example.

When the active gas plasma is supplied onto the metal layer 20, the surface of the metal layer 20 is activated. When activated, the metal positioned on the surface of the metal layer 20 may be combined with the active gas. For example, when the metal layer 20 includes cobalt (Co) and the active gas includes chlorine ($Cl_2$), cobalt (Co) disposed on the surface of the metal layer 20 may be substituted with cobalt chloride ($CoCl_2$). For example, cobalt (Co) may be subjected to a coordinate bond with chlorine (Cl).

The active gas may thus react with the metal layer 20. In contrast, the active gas does not react with the insulating layer 30. Thus, according to the atomic layer etching method of some embodiments of the inventive concepts, the insulating layer 30 is not etched, and only the metal layer 20 may selectively be etched.

In some embodiments, the active gas may be supplied at a flow rate of 1 standard cubic centimeter per minute (sccm) to 50 sccm. Preferably, the active gas may be supplied at a flow rate of 10 sccm to 50 sccm. In some embodiments, the active gas may be supplied at a flow rate of 20 sccm to 50 sccm for 5 seconds to 60 seconds. Preferably, the active gas may be supplied at a flow rate of 20 sccm to 50 sccm for 10 seconds to 40 seconds. More preferably, the active gas may be supplied at a flow rate of 20 sccm to 50 sccm for 15 to 30 seconds. However, embodiments of the inventive concepts are not limited to these examples.

In some embodiments, the active gas may be supplied using a transport gas. The transport gas may be supplied at a flow ratio of five times or more as compared with the active gas. For example, the flow ratio of the active gas to the transport gas may be 1:8 to 1:30. Preferably, the flow ratio of the active gas to the transport gas may be 1:10 to 1:25. More preferably, the flow ratio of the active gas to the transport gas may be 1:15 to 1:20.

In some embodiments, the transport gas may be supplied at a flow rate of 100 sccm to 5000 sccm, in the range satisfying the flow rate ratio described above. Preferably, the transport gas may be supplied at a flow rate of 300 scmm to 4000 scmm More preferably, the transport gas may be supplied at a flow rate of 450 sccm to 3500 sccm.

In some embodiments, the active gas plasma may be excited with a power of 500 W or less. Preferably, the active gas may be excited with a power of 10 W to 300 W. More preferably, the active gas may be excited with a power of 30 W to 100 W. The plasma may be generated by applying radio frequency (RF) or microwave (MW) power.

The transport gas may be used without limitation as a material that does not react with the metal layer 20 or etching byproducts. The transport gas may include, but is not limited to, at least one of argon (Ar), nitrogen ($N_2$), or helium (He).

In FIG. 5, an etching support gas is supplied onto the metal layer 20 (S202). The etching support gas may be a ligand. The etching support gas may be, for example, an amine-based material. Preferably, the etching support gas may be a triamine-based material.

The etching support gas may be expressed by the following general formula (1), for example:

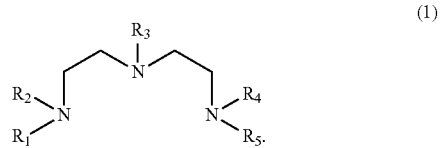

(1)

In the general formula (1), each of R1, R2, R3, R4 and R5 may independently include hydrogen or a $C_1$-$C_4$ alkyl group, and N is nitrogen. That is, each of R1, R2, R3, R4 and R5 may be hydrogen, or may be alkyl groups of one to four carbons, but embodiments of the inventive concepts are not limited thereto.

More preferably, the etching support gas may be pentamethyldiethylenetriamine (PMDETA). The pentamethyldiethylenetriamine (PMDETA) may be expressed by the following formula:

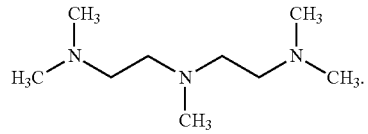

Hereinafter, the description will be based on the etching support gas being pentamethyldiethylenetriamine (PMDETA).

When the etching support gas is supplied onto the metal layer 20, the etching support gas may be subjected to a coordinate bond with the metal disposed on the surface of the metal layer 20. The etching support gas may form a coordinated complex with the metal included in the metal layer 20. For example, when the metal layer 20 includes cobalt (Co) and the etching support gas includes pentamethyldiethylenetriamine (PMDETA), the cobalt (Co) on the surface of the metal layer 20 may be subjected to a coordinate bond with pentamethyldiethylenetriamine (PMDETA). The coordinate-bonded compound may be a cobalt-PMDETA complex.

The cobalt-ligand complex formed using the etching support gas as a ligand, for example, the cobalt-PMDETA complex, may have improved volatility. That is, the cobalt-PMDETA complex may easily be moved or purged even at a lower temperature.

Therefore, when the cobalt-PMDETA complex is evaporated, excessive energy is not consumed. The cobalt-PMDETA complex may also be evaporated at a relatively fast rate.

The cobalt-PMDETA complex may implement a saturated etch rate with less etching support gas consumption. In addition, the cobalt-PMDETA complex may implement a saturated etch rate within a short time. Therefore, when the atomic layer etching method according to some embodiments of the inventive concepts is used, etching damage due to plasma may be minimized.

The etching support gas may react with the metal layer 20. The etching support gas does not react with the insulating layer 30. Therefore, when the atomic layer etching method according to some embodiments of the inventive concepts is used, only the metal layer 20 is selectively etched without etching of the insulating layer 30.

In some embodiments, the etching support gas may be supplied using a transport gas. The transport gas for flowing the etching support gas may be supplied at a flow rate of 1 sccm to 100 sccm. Preferably, the transport gas may be supplied at a flow rate of 5 sccm to 50 sccm. More preferably, the transport gas may be supplied at a flow rate of 10 sccm to 30 sccm.

Figure 6:
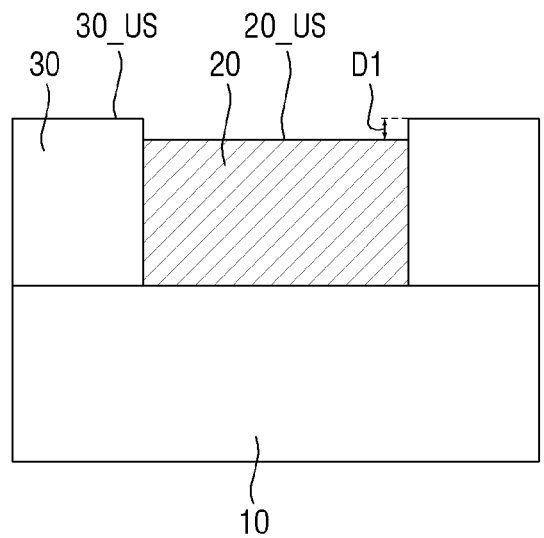
FIGS. 6 and 7 illustrate exemplary cross-sectional views descriptive of an atomic layer etching method according to embodiments of the inventive embodiments.
Figure 7:
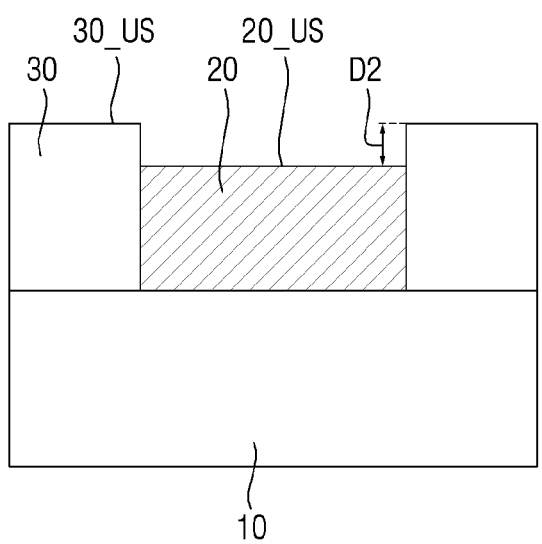

FIGS. 6 and 7 illustrate exemplary cross-sectional views descriptive of an atomic layer etching method according to embodiments of the inventive concepts. For reference, FIG. 6 illustrates a cross-sectional view of the etched metal layer 20 after the etching cycle (e.g., S2 of FIG. 1) is performed once on the structure shown in FIG. 5 for example. FIG. 7 illustrates a cross-sectional view of the etched metal layer 20 after the etching cycle is performed twice. In the following description, it is assumed that in the structure shown in FIG. 5, as measured from the upper surface of the first substrate 10, the height of the upper surface 20_US of the metal layer 20 is the same as the height of the upper surface 30_US of the insulating layer 30.

Referring to FIG. 6, when (or after) the etching cycle is performed once, the metal layer 20 may be etched as much as a first amount such that the height of the metal layer 20 is reduced by the first distance D1.

After the metal layer 20 is etched, the upper surface 20_US of the metal layer 20 is lower than the upper surface 30_US of the insulating layer 30. As measured from the upper surface of the first substrate 10, the upper surface 20_US of the metal layer 20 has a height less than that of the upper surface 30_US of the insulating layer 30. The difference in height of the upper surface 20_US of the metal layer 20 and the upper surface 30_US of the insulating layer 30 may be the first distance D1. That is, the metal layer 20 may be etched as much as the first distance D1 (or in other words etched a first amount or thickness).

Referring to FIG. 7, when (or after) the etching cycle is performed twice, the metal layer 20 may be etched in total as much as a second amount such that the height of the metal layer 20 is reduced by a second distance D2.

The difference between the upper surface 20_US of the metal layer 20 and the upper surface 30_US of the insulating layer 30 may be the second distance D2. The second distance D2 may be twice the first distance DL That is, when the etching cycle is performed once, the height of the metal layer 20 is lowered or decreased as much as the first distance D1. When the etching cycle is performed twice, the height of the metal layer 20 is lowered or decreased as much as the second distance D2. The second distance D2 may be twice the first distance D1.

In other words, whenever the etching cycle is performed once, the height of the metal layer 20 may be lowered or decreased as much as the first distance D1. When the etching cycle is performed n times, the height of the metal layer 20 may be lowered or decreased as much as (n×first distance D1). In this way, when the atomic layer etching method of the inventive concepts is used, the metal layer 20 may be etched to reach a desired height.

Figure 8:
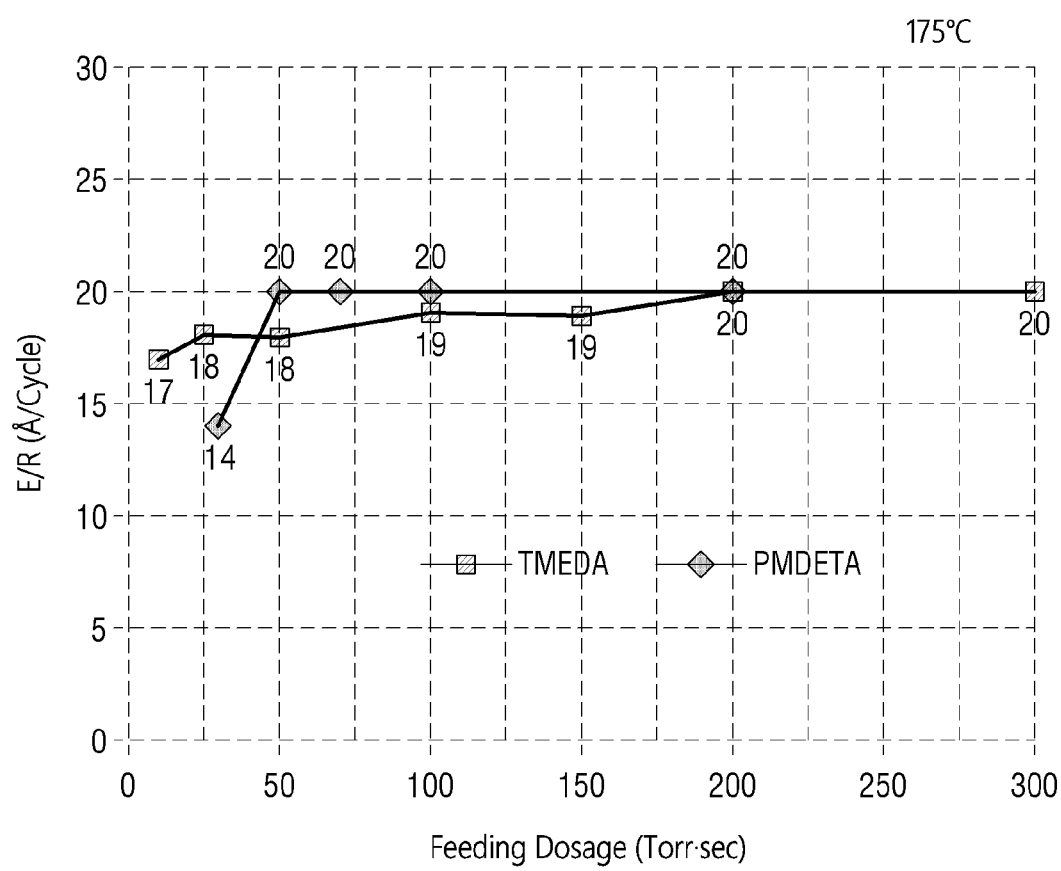
FIG. 8 illustrates a graph showing an etch rate per one etching cycle according to a feeding dosage of the etching support gas at a substrate temperature of 175° C. of an embodiment of the inventive concepts and Comparative Example 1.

FIG. 8 illustrates a graph showing an etch rate per one etching cycle according to a feeding dosage of the etching support gas at a substrate temperature of 175° C. of Embodiment 1 according to the inventive concepts and Comparative Example 1. The horizontal axis represents the feeding dosage of the etching cycle in units of etching in units of Torr-sec, and the vertical axis represents the etch rate of the etching cycle in units of Å/cycle. The etching support gas in the Embodiment 1 is pentamethyldiethylenetriamine (PMDETA) as represented b y the curve including diamond-shaped symbols. The etching support gas in the Comparative Example 1 is tetramethylethylenediamine (TMEDA) as represented by the curve including square-shaped symbols.

The Embodiment 1 and the Comparative Example 1 are as follows.

Embodiment 1

A cobalt thin film was etched using an atomic layer etching (ALE) method. The cobalt thin film was formed on a substrate. A temperature of the substrate was maintained at 175° C. or 200° C. A hydrogen gas was used for a pre-treatment process to reduce a surface of the cobalt thin film. A chlorine gas was used as a reactant (i.e., an active gas) for forming cobalt chloride.

A pentamethyldiethylenetriamine (PMDETA) was used as the etching support gas for etching. Pentamethyldiethylenetriamine (PMDETA) was filled in a stainless steel bubbler vessel and used by being maintained at 76° C. At this temperature, a vapor pressure of pentamethyldiethylenetriamine (PMDETA) is 10 torr.

In accordance with the pre-treatment process of the etching process, the hydrogen gas was plasma-treated to be injected into the cobalt thin film. The residual hydrogen gas was removed from the chamber during a period of 20 seconds.

One etching cycle of the atomic layer etching method included four steps as follows. First, the chlorine gas is plasma-treated and injected into the cobalt thin film for 24 seconds. The chlorine gas reacts with the cobalt thin film to form a cobalt chloride thin film. Second, the chlorine gas is removed from the chamber during a period of 20 seconds. Third, in the stainless steel bubbler vessel filled with pentamethyldiethylenetriamine (PMDETA), a vaporized etching support gas is transferred to the cobalt chloride thin film. The etching support gas forms a complex with cobalt chloride. Fourth, the cobalt-PMDETA complex, the reaction byproducts, and the residual gas are removed.

Based on the above process performed as one etching cycle, five etching cycles were repeatedly performed. A cobalt metal thin film having no pattern was etched using the atomic layer etching method. Then, a thickness of the cobalt thin film was checked during the above-described method. In addition, the atomic layer etching method was performed on a micro-patterned structure including an insulating film and a cobalt film. The etching amount of the cobalt thin film was checked during the above-described method.

Comparative Example 1

A cobalt thin film was etched using an atomic layer etching (ALE) method. The cobalt thin film was formed on a substrate. A temperature of the substrate was maintained at 175° C. or 200° C. A hydrogen gas was used for a pre-treatment process to reduce a surface of the cobalt thin film. A chlorine gas was used as a reactant for forming cobalt chloride.

A tetramethylethylenediamine (TMEDA) was used as the etching support gas for etching. Tetramethylethylenediamine (TMEDA) was filled in a stainless steel bubbler vessel and used by being maintained at 76° C. At this temperature, a vapor pressure of tetramethylethylenediamine (TMEDA) is 10 torr.

In accordance with the pre-treatment process of the etching process, the hydrogen gas was plasma-treated to be injected into the cobalt thin film. The residual hydrogen gas was removed from the chamber during a period of 20 seconds.

One etching cycle of the atomic layer etching method included four steps as follows. First, the chlorine gas is plasma-treated and injected into the cobalt thin film for 24 seconds. The chlorine gas reacts with the cobalt thin film to form a cobalt chloride thin film. Second, the chlorine gas is removed during a period of 20 seconds. Third, in the stainless steel bubbler vessel filled with tetramethylethylenediamine (TMEDA), a vaporized etching support gas is transferred to the cobalt chloride thin film. The etching support gas forms a complex with cobalt chloride. Fourth, the cobalt-TMEDA complex, the reaction byproducts, and the residual gas are removed.

Based on the above process performed as one etching cycle, five etching cycles were repeatedly performed. A cobalt metal thin film having no pattern was etched using the atomic layer etching method. Then, a thickness of the cobalt thin film was checked during the above-described method. In addition, the atomic layer etching method was performed on a micro-patterned structure including an insulating film and a cobalt film. The etching amount of the cobalt thin film was checked during the above-described method.

Referring to FIG. 8, in the Embodiment 1, the feeding dosage of pentamethyldiethylenetriamine (PMDETA) was adjusted over a range of 50 Torr·sec to 300 Torr·sec.

When the feeding dosage of pentamethyldiethylenetriamine (PMDETA) ranges from 50 Torr·sec to 300 Torr·sec, the etch rate of the metal layer was 20 Å/cycle as indicated by the curve with the diamond-shaped symbols.

Preferably, the feeding dosage of pentamethyldiethylenetriamine (PMDETA) may range from 50 Torr·sec to 200 Torr·sec. More preferably, the feeding dosage of pentamethyldiethylenetriamine (PMDETA) may range from 50 Torr·sec to 70 Torr·sec.

When the feeding dosage of pentamethyldiethylenetriamine (PMDETA) ranges from 50 Torr·sec to 70 Torr·sec, a maximum etch rate according to one etching cycle may be implemented. The maximum etch rate may be 20 Å/cycle when the temperature of the substrate is 175° C. When the temperature of the substrate is constant, the etch rate is not increased even though the feeding dosage of pentamethyldiethylenetriamine (PMDETA) is increased. That is, even though the amount of pentamethyldiethylenetriamine (PMDETA) is increased, the etch rate does not exceed 20 Å/cycle.

In the Comparative Example 1, the feeding dosage of tetramethylethylenediamine (TMEDA) was adjusted over a range of 50 Torr·sec to 300 Torr·sec.

When the feeding dosage of tetramethylethylenediamine (TMEDA) ranges from 200 Torr·sec to 300 Torr·sec, the etch rate may be 20 Å/cycle as indicated by the curve with the square-shaped symbols. When the feeding dosage of tetramethylethylenediamine (TMEDA) ranges from 50 Torr·sec to 70 Torr·sec, the etch rate may be about 18 Å/cycle to 18.5 Å/cycle.

Accordingly, by comparison, when the feeding dosage of pentamethyldiethylenetriamine (PMDETA) is 50 Torr·sec, the etch rate may be 20 Å/cycle. On the other hand, when the feeding dosage of tetramethylethylenediamine (TMEDA) is 50 Torr·sec, the etch rate may be 18 Å/cycle.

When the feeding dosage of pentamethyldiethylenetriamine (PMDETA) is 70 Torr·sec, the etch rate may be 20 Å/cycle. On the other hand, when the feeding dosage of tetramethylethylenediamine (TMEDA) is 70 Torr·sec, the etch rate may be 18.5 Å/cycle.

That is, when the feeding dosage of the pentamethyldiethylenetriamine (PMDETA) ranges from 50 Torr·sec to 70 Torr·sec, a better etch rate may be implemented as compared with the case that the feeding dosage of tetramethylethylenediamine (TMEDA) ranges from 50 Torr·sec to 70 Torr·sec.

That is, when the temperature of the substrate is 175° C., and when the feeding dosage of pentamethyldiethylenetriamine (PMDETA) ranges from 50 Torr·sec to 70 Torr·sec, the maximum etch rate may be implemented as compared with the Comparative Example 1.

Figure 9:
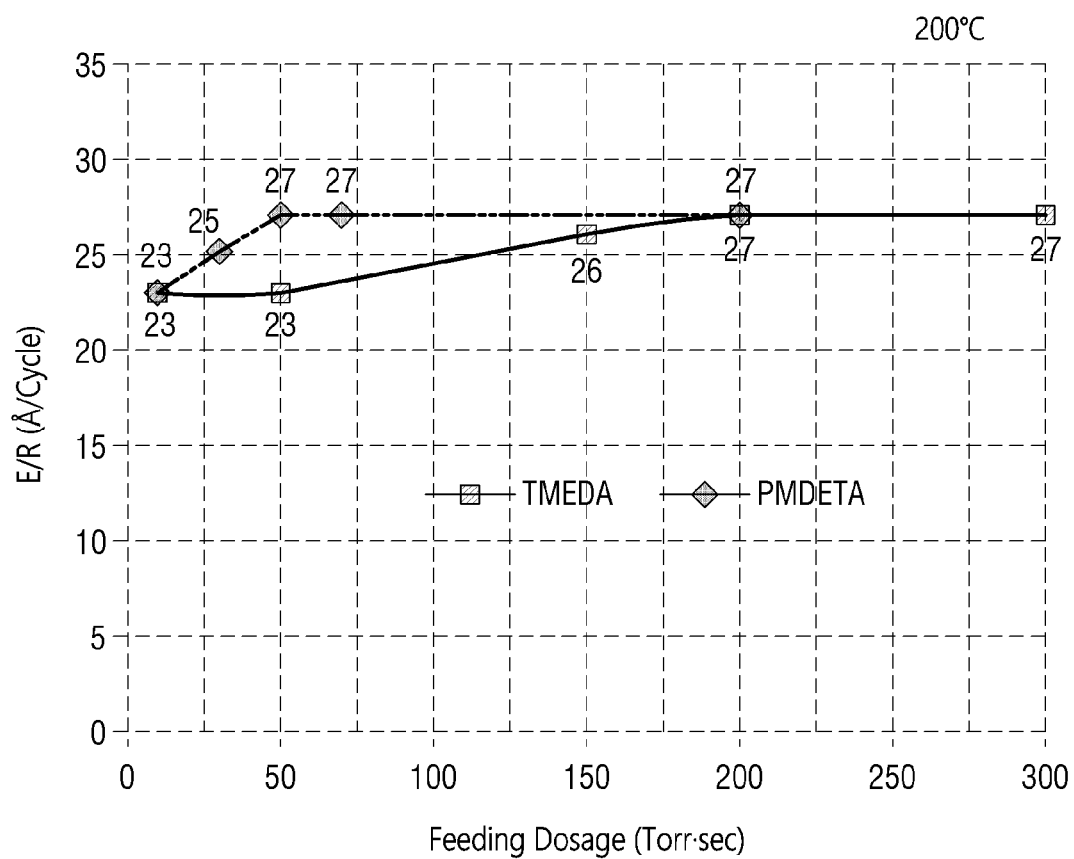
FIG. 9 illustrates a graph showing an etch rate per one etching cycle according to a feeding dosage of an etching support gas at a substrate temperature of 200° C. of an embodiment of the inventive concepts and Comparative Example 1.

FIG. 9 illustrates a graph showing an etch rate per one etching cycle according to a feeding dosage of an etching support gas at a substrate temperature of 200° C. of Embodiment 1 according to the inventive concepts and the Comparative Example 1. Similar as described with respect to FIG. 8, the etching support gas in Embodiment 1 is pentamethyldiethylenetriamine (PMDETA), and the etching support gas in the Comparative Example 1 is tetramethylethylenediamine (TMEDA).

Referring to FIG. 9, in the Embodiment 1, the feeding dosage of pentamethyldiethylenetriamine (PMDETA) was adjusted over a range of 50 Torr·sec to 300 Torr·sec.

When the feeding dosage of pentamethyldiethylenetriamine (PMDETA) ranges from 50 Torr·sec to 300 Torr·sec, the etch rate may be 27 Å/cycle as indicated by the curve with the diamond-shaped symbols.

Preferably, the feeding dosage of pentamethyldiethylenetriamine (PMDETA) may range from 50 Torr·sec to 200 Torr·sec. More preferably, the feeding dosage of pentamethyldiethylenetriamine (PMDETA) may range from 50 Torr·sec to 70 Torr·sec.

In some embodiments, when the feeding dosage of pentamethyldiethylenetriamine (PMDETA) ranges from 50 Torr·sec to 70 Torr·sec, the maximum etch rate according to one etching cycle may be implemented. When the temperature of the substrate is 200° C., the maximum etch rate may be 27 Å/cycle. When the temperature of the substrate is constant, the etch rate does not exceed 27 Å/cycle even though the feeding dosage of pentamethyldiethylenetriamine (PMDETA) is increased.

In the Comparative Example 1, the feeding dosage of tetramethylethylenediamine (TMEDA) was adjusted over a range of 50 Torr·sec to 300 Torr·sec as indicated by the curve including the square-shaped symbols.

When the feeding dosage of tetramethylethylenediamine (TMEDA) ranges from 200 Torr·sec to 300 Torr·sec, the etch rate may be 27 Å/cycle. When the feeding dosage of tetramethylethylenediamine (TMEDA) ranges from 50 Torr·sec to 150 Torr·sec, the etch rate may be about 23 Å/cycle to 26 Å/cycle. When the feeding dosage of tetramethylethylenediamine (TMEDA) ranges from 50 Torr·sec to 70 Torr·sec, the etch rate may be about 23 Å/cycle to 24 Å/cycle.

Accordingly, by comparison, when the feeding dosage of pentamethyldiethylenetriamine (PMDETA) is 50 Torr·sec, the etch rate may be 27 Å/cycle. On the other hand, when the feeding dosage of tetramethylethylenediamine (TMEDA) is 50 Torr·sec, the etch rate may be 23 Å/cycle.

When the feeding dosage of pentamethyldiethylenetriamine (PMDETA) is 150 Torr·sec, the etch rate may be 27 Å/cycle. On the other hand, when the feeding dosage of tetramethylethylenediamine (TMEDA) is 150 Torr·sec, the etch rate may be 26 Å/cycle.

That is, when the feeding dosage of pentamethyldiethylenetriamine (PMDETA) ranges from 50 Torr·sec to 150 Torr·sec, a better etch rate may be implemented as compared with the case that the feeding dosage of tetramethylethylenediamine (TMEDA) ranges from 50 Torr·sec to 150 Torr·sec.

When the feeding dosage of pentamethyldiethylenetriamine (PMDETA) is 50 Torr·sec, the etch rate may be 27 Å/cycle. When the amount of tetramethylethylenediamine (TMEDA) is 50 Torr·sec, the etch rate may be 23 Å/cycle.

When the feeding dosage of pentamethyldiethylenetriamine (PMDETA) is 70 Torr·sec, the etch rate may be 27 Å/cycle. When the feeding dosage of tetramethylethylenediamine (TMEDA) is 70 Torr·sec, the etch rate may be 24 Å/cycle.

That is, when the feeding dosage of the pentamethyldiethylenetriamine (PMDETA) ranges from 50 Torr·sec to 70 Torr·sec, a better etch rate may be implemented as compared with the case that the feeding dosage of tetramethylethylenediamine (TMEDA) ranges from 50 Torr·sec to 70 Torr·sec.

When the temperature of the substrate is 200° C., and when the feeding dosage of pentamethyldiethylenetriamine (PMDETA) ranges from 50 Torr·sec to 70 Torr·sec, the maximum etch rate may be implemented as compared with the Comparative Example 1.

Figure 10:
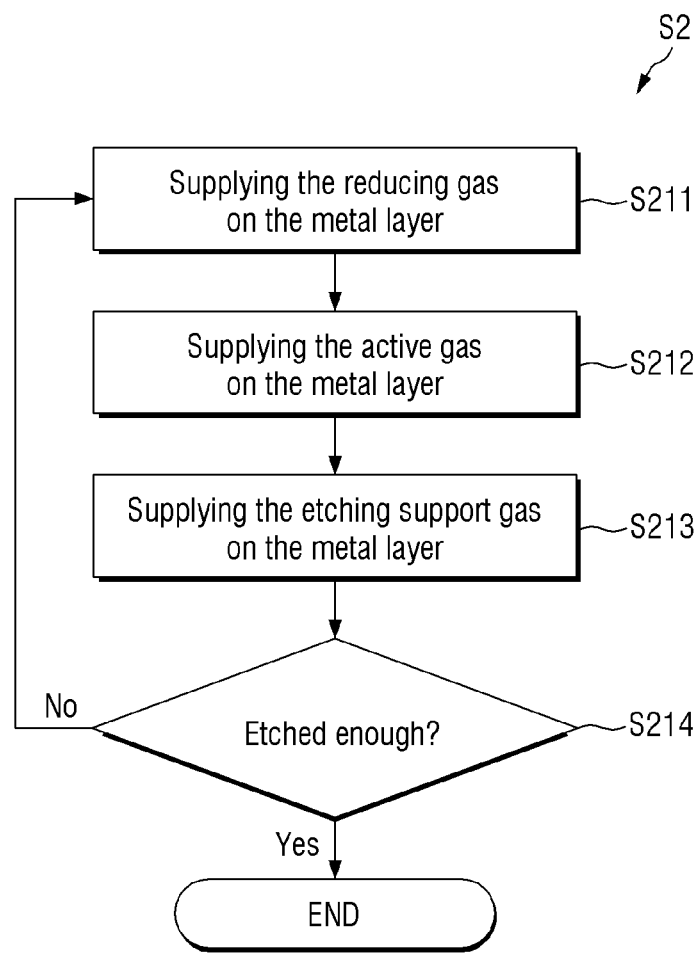
FIG. 10 illustrates a flow chart descriptive of an atomic layer etching method according to embodiments of the inventive concepts.
Figure 11:
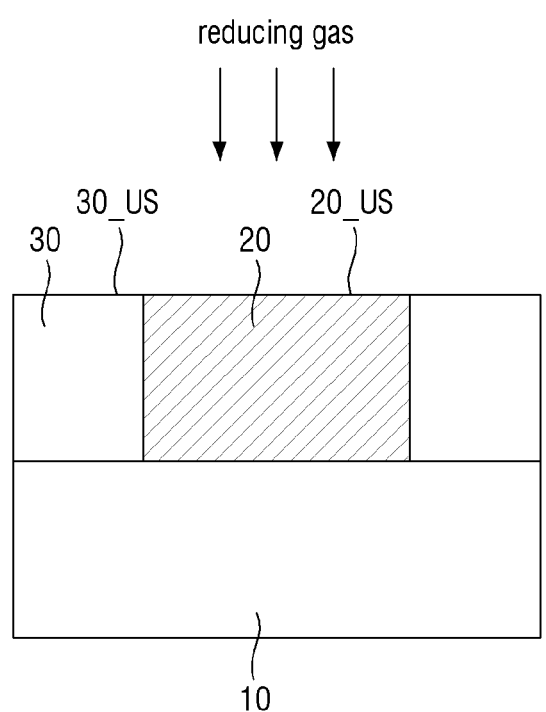
FIG. 11 illustrates an exemplary cross-sectional view descriptive of step S211 of FIG. 10.

FIG. 10 illustrates a flow chart descriptive of an atomic layer etching method according to embodiments of the inventive concepts. FIG. 11 illustrates an exemplary cross-sectional view descriptive of step S211 of FIG. 10. For reference, FIG. 10 may be a flow chart illustrating step S2 of FIG. 1. For convenience, differences between the embodiments of FIGS. 3 and 10 will be hereinafter described.

Referring to FIGS. 10 and 11, the etching of at least a portion of the metal layer (S2) may further include supplying a reducing gas onto the metal layer (S211).

The etching of at least a portion of the metal layer (S2) may include one or more etching cycles. The etching cycle may include supplying a reducing gas onto the metal layer (S211), supplying an active gas onto the metal layer (S212), and supplying an etching support gas onto the metal layer (S213). When the metal layer 20 is etched as desired or in other words is etched a desired thickness (Yes in S214), the etching of at least a portion of the metal layer (S2) is terminated. When the metal layer 20 is not etched as desired or in other words is not etched a desired thickness (No in S214), the etching cycle may be repeated.

The supplying of a reducing gas onto the metal layer (S211) may be a pre-treatment process that reduces the surface of the metal layer 20 before supplying the active gas. That is, the atomic layer etching method according to some embodiments may further include performing a pre-processing process that reduces the surface of the metal layer 20, before supplying the active gas onto the metal layer 20. The performing of a pre-treatment process may include supplying the reducing gas onto the metal layer 20.

The reducing gas may be a gas containing a hydrogen atom. The reducing gas may include, for example, at least one of hydrogen ($H_2$), ammonia ($NH_3$), silane ($SiH_4$), borane ($BH_3$), diborane ($B_2H_6$), phosphine ($PH_3$), or hydrazine ($N_2H_4$).

For example, when the metal layer 20 includes cobalt (Co), the surface of the metal layer 20 may include cobalt oxide (CoO). The reducing gas may be supplied to the metal layer 20 to reduce the cobalt oxide (CoO) on the surface of the metal layer 20 to cobalt (Co).

The reduction gas may be supplied at a flow rate of 100 sccm to 5000 sccm. Preferably, the reducing gas may be supplied at a flow rate of 300 sccm to 4000 sccm. More preferably, the reducing gas may be supplied at a flow rate of 500 sccm to 3000 sccm.

Figure 12:
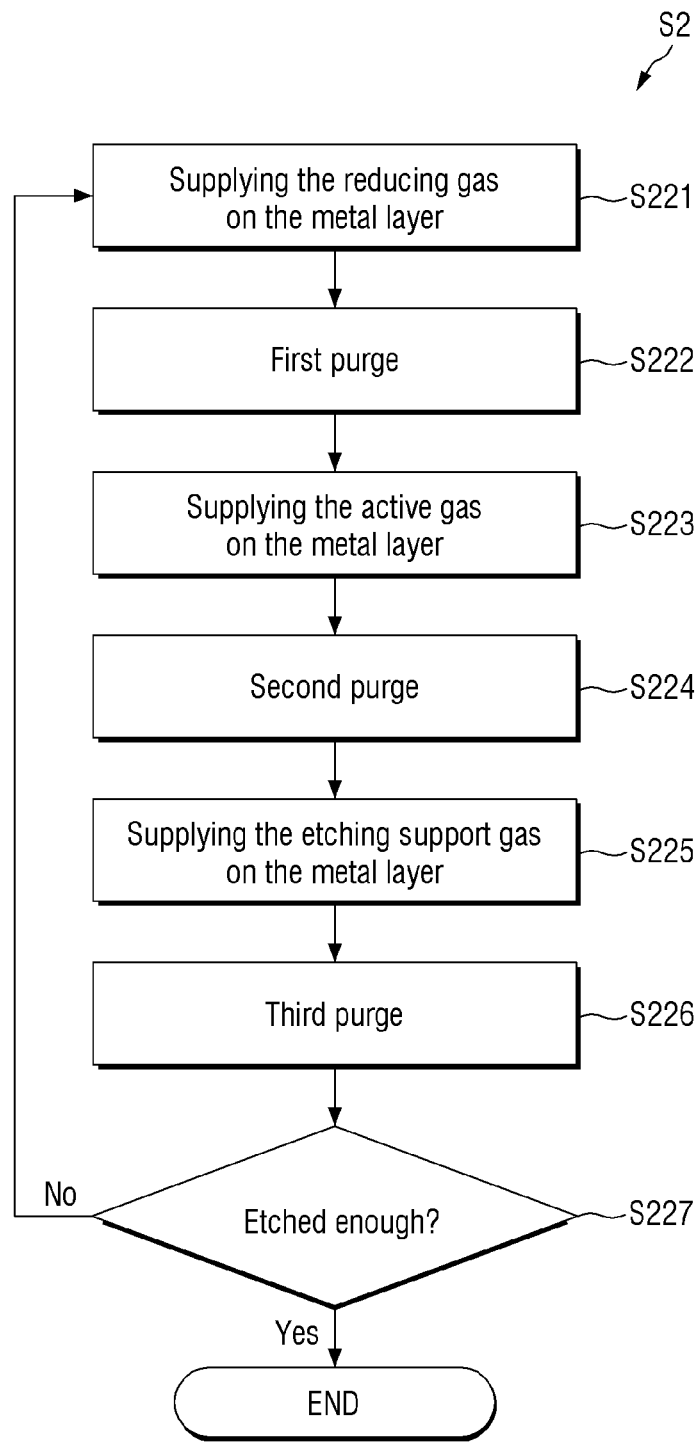
FIG. 12 illustrates a flow chart descriptive of an atomic layer etching method according to embodiments of the inventive concepts.

FIG. 12 illustrates a flow chart descriptive of an atomic layer etching method according to embodiments of the inventive concepts. For reference, FIG. 12 may be a flow chart illustrating step S2 of FIG. 1. For convenience, differences between the embodiments of FIGS. 3 and 12 are hereinafter described.

Referring to FIG. 12, the etching of at least a portion of the metal layer (S2) may further include a first purge step (S222), a second purge step (S224), and a third purge step (S226).

The etching of at least a portion of the metal layer (S2) may include one or more etching cycles. The etching cycle may include supplying a reducing gas onto the metal layer (S221), performing the first purge step (S222), supplying an active gas onto the metal layer (S223), performing the second purge step (S224), supplying an etching support gas onto the metal layer (S225), and performing the third purge step (S226). When the metal layer is etched as desired or in other words is etched a desired thickness (Yes in S227), the etching at of least a portion of the metal layer (S2) is terminated. When the metal layer is not etched as desired or in other words is not etched a desired thickness (No in S227), the etching cycle may be repeated.

The first purge step (S222) may be to remove the residual reducing gas before supplying the active gas onto the metal layer 20, for example after supplying the reducing gas onto the metal layer 20. The second purge step (S224) may be to remove the residual active gas before supplying the etching support gas onto the metal layer 20, for example after supplying the active gas onto the metal layer 20. The third purge step (S226) may be to allow the etching support gas to be subjected to metal-ligand reaction with the metal layer 20 and remove the residual etching support gas, for example after supplying the etching support gas onto the metal layer 20.

A purge gas in the first to third purge steps (S222, S224 and S226) may be the same as the transport gas described above, but embodiments of the inventive concepts are not limited thereto. The purge gas may be a mixture of different inert gases.

Figure 13:
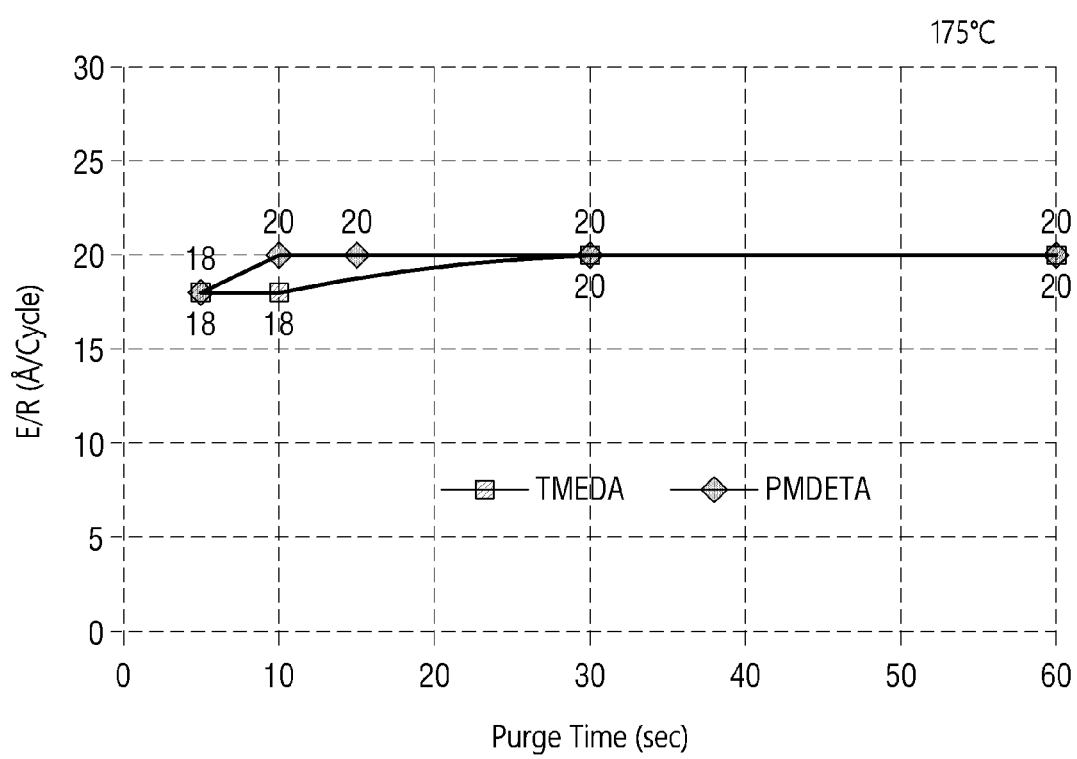
FIG. 13 illustrates a graph showing an etch rate per one etching cycle according to a purge time of an etching support gas at a substrate temperature of 175° C. of an embodiment of the inventive concepts and Comparative Example 1.

FIG. 13 illustrates a graph showing an etch rate per one etching cycle according to a purge time of an etching support gas at a substrate temperature of 175° C. of the Embodiment 1 according to the inventive concepts and the Comparative Example 1. In FIG. 13 the horizontal axis represents purge time in units od seconds, and the vertical axis represents etch rate in units of Å/cycle.

That is, FIG. 13 is a graph showing an etch rate per one etching cycle according to a purge time of an etching support gas in the third purge step (e.g., S226 of FIG. 12). The etching support gas in the Embodiment 1 is pentamethyldiethylenetriamine (PMDETA). The etching support gas in the Comparative Example 1 is tetramethylethylenediamine (TMEDA).

Referring to FIG. 13, in the Embodiment 1, the purge time of pentamethyldiethylenetriamine (PMDETA) in the third purge step was adjusted over a range of 10 seconds to 60 seconds as represented by the curve including diamond-shaped symbols.

When the purge time of pentamethyldiethylenetriamine (PMDETA) ranges from 10 seconds to 60 seconds, the etch rate may be 20 Å/cycle.

Preferably, the purge time of pentamethyldiethylenetriamine (PMDETA) may range from 10 seconds to 15 seconds.

In some embodiments, when the purge time of pentamethyldiethylenetriamine (PMDETA) ranges from 10 seconds to 15 seconds, the maximum etch rate according to one etching cycle may be implemented.

In the Comparative Example 1, the purge time of tetramethylethylenediamine (TMEDA) was adjusted over a range of 10 seconds to 60 seconds as represented by the curve including square-shaped symbols. When the purge time of tetramethylethylenediamine (TMEDA) ranges from 10 seconds to 15 seconds, the etch rate may be 18 Å/cycle to 19 Å/cycle.

That is, when the purge time of the pentamethyldiethylenetriamine (PMDETA) ranges from 10 seconds to 15 seconds, a better etch rate may be implemented as compared with the case that the purge time of tetramethylethylenediamine (TMEDA) ranges from 10 seconds to 15 seconds.

FIGS. 14 to 32 illustrate views of intermediate steps descriptive of a semiconductor device manufacturing method using an atomic layer etching method according to some embodiments of the inventive concepts.

Figure 14:
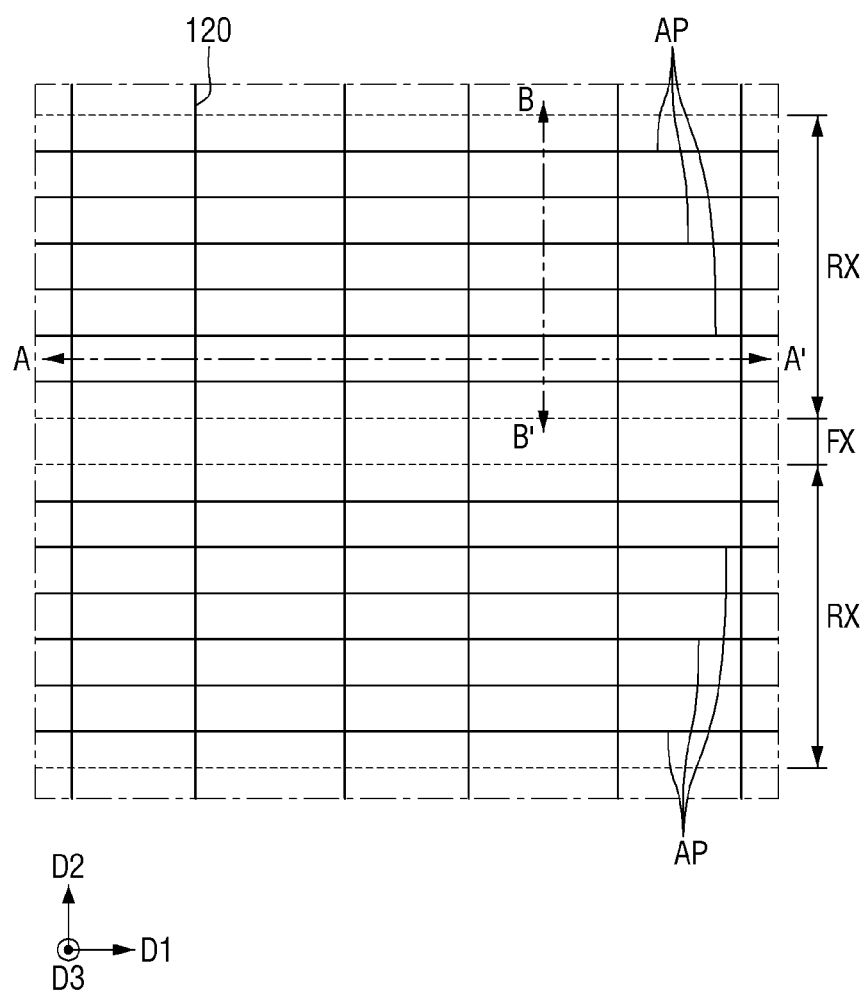
FIGS. 14, 15, 16, 17, 18, 19, 20, 21, 22, 23, 24, 25, 26, 27, 28, 29, 30, 31 and 32 illustrate intermediate steps descriptive of a semiconductor device manufacturing method using an atomic layer etching method according to embodiments of the inventive concepts.

FIG. 14 illustrates a layout or top plan view descriptive of a semiconductor device manufacturing method according to some embodiments. For reference, FIGS. 15, 17, 19, 21, 23, 25, 27, 29 and 31 illustrate cross-sectional views taken along line A-A' of FIG. 14. FIGS. 16, 18, 20, 22, 24, 26, 28, 30 and 32 illustrate cross-sectional views taken along line B-B' of FIG. 14.

Figure 15:
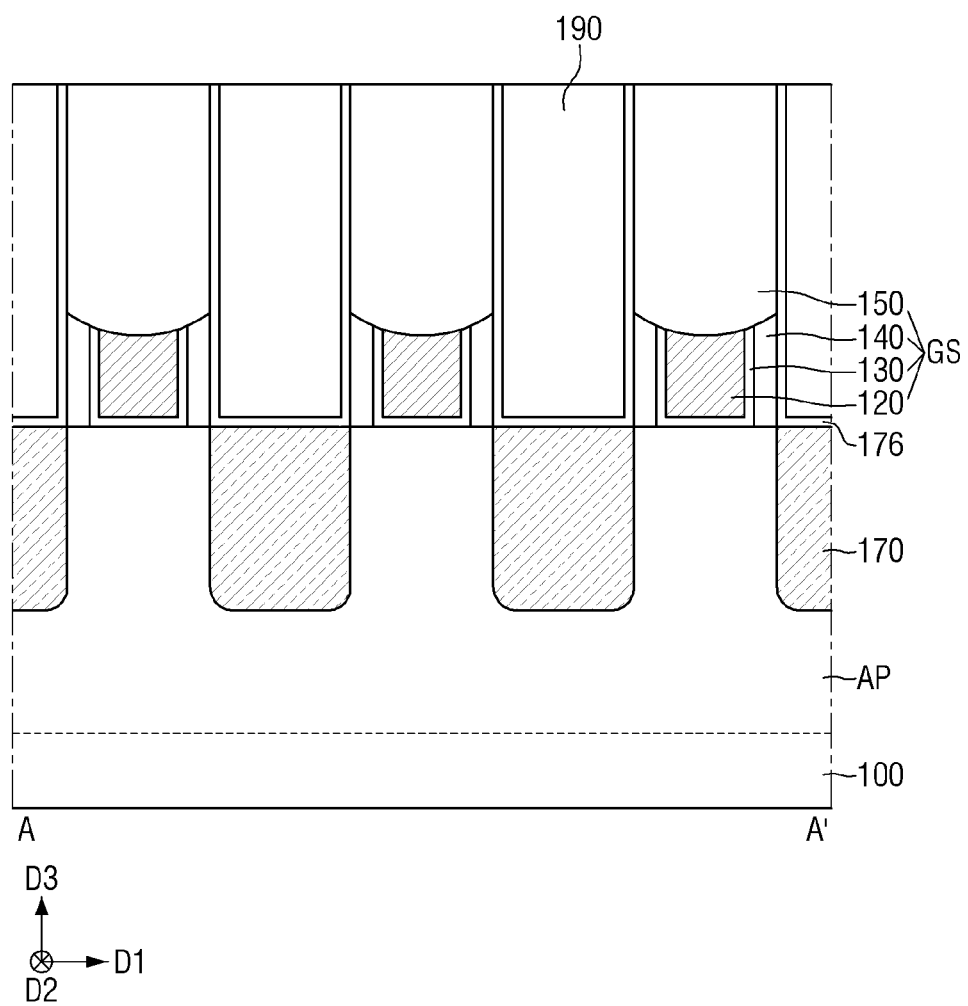
Figure 16:
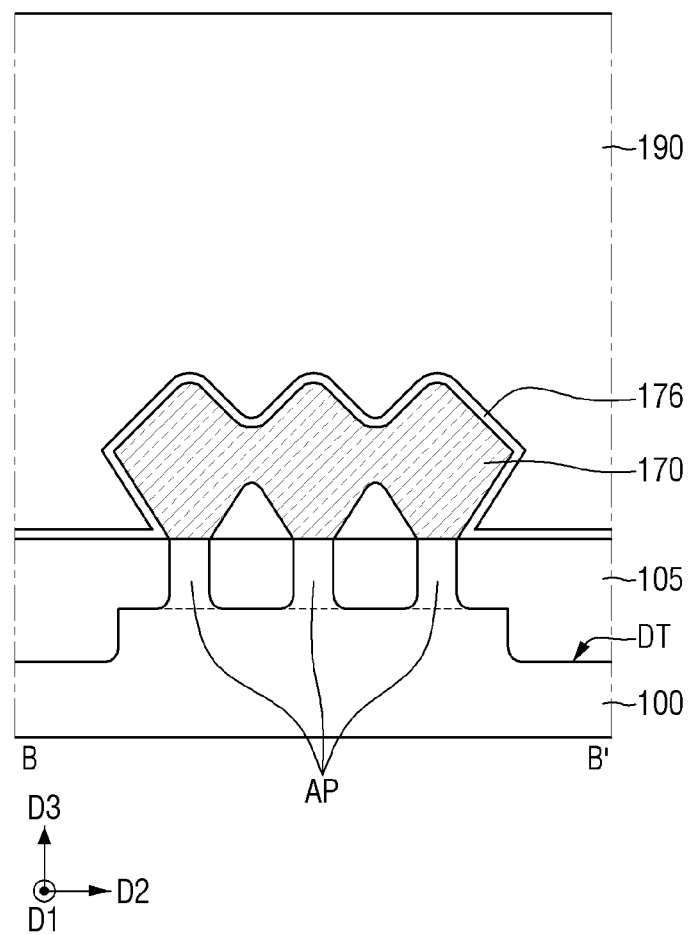

Referring to FIGS. 14 to 16, a second substrate 100 may be provided. The second substrate 100 may include an active region RX and a field region FX. The field region FX may be formed to be directly adjacent to the active region RX. The field region FX may form a boundary of the active region RX.

The active regions RX may be spaced apart from each other by the field region FX. In other words, a device isolation film may be formed in the vicinity of the active regions RX that are spaced apart from each other. A portion between the active regions RX of the device isolation film may be the field region FX. For example, a portion where a channel region of a transistor is formed may be the active region, and a portion for identifying the channel region of the transistor, which is formed in the active region, may be the field region. Alternatively, the active region may be a fin-type pattern or nano-sheet region used as the channel region of the transistor, and the field region may be a region where a fin-type pattern or nano-sheet used as the channel region is not formed.

As shown in FIG. 16, the field region FX may be defined by a deep trench DT, but is not limited thereto. In addition, it should be apparent that a person with ordinary skill in the art to which the present disclosure pertains may identify a field region from an active region.

The second substrate 100 may be the same as the first substrate (e.g., 10 of FIG. 2). The second substrate 100 may be, for example, a silicon substrate or a silicon-on-insulator (SOI). Alternatively, the second substrate 100 may include, but is not limited to, silicon germanium, silicon germanium on insulator (SGOI), indium antimonide, lead telluride compound, indium arsenide, indium phosphide, gallium arsenide or gallium antimonide.

At least one active pattern AP may be formed on the active region RX of the second substrate 100. The active pattern AP may be longitudinally extended along a first direction D1 on the second substrate 100. For example, the active pattern AP may include a long side extended in the first direction D1 and a short side extended in a second direction D2. In this case, the first direction D1 may cross the second direction D2 and a third direction D3. In addition, the second direction D2 may cross the third direction D3.

The active pattern AP may be a multi-channel active pattern. For example, the active pattern AP may be a fin-type pattern. As another example, the active pattern AP may include a sheet pattern. The active pattern AP may be used as a channel pattern of the transistor. Although three active patterns AP are shown as illustrated particularly in FIG. 16 for example, this is only for convenience of description, and the number of active patterns AP are not limited thereto. The active pattern AP may include one or more.

The active pattern AP may be a portion of the second substrate 100, and may include an epitaxial layer grown from the second substrate 100. The active pattern AP may include, for example, silicon or germanium, which is an elemental semiconductor material. In addition, the active pattern AP may include a compound semiconductor, and may include, for example, a group IV-IV compound semiconductor or a group III-V compound semiconductor.

A field insulating film 105 may be formed on the second substrate 100. The field insulating film 105 may be formed over the active region RX and the field region FX. The field insulating film 105 may fill the deep trench DT. The field insulating film 105 may include, for example, an oxide film, a nitride film, an oxynitride film, or a film that is a combination thereof.

At least one gate structure GS may be formed on the second substrate 100. The gate structure GS may be formed to be extended in the second direction D2. The gate structures GS may be spaced apart from each other in the first direction D1.

The gate structure GS may include, for example, a gate electrode 120, a gate insulating film 130, a gate spacer 140, and a gate capping pattern 150.

The gate electrode 120 may be formed on the active pattern AP. The gate electrode 120 may cross the active pattern AP.

The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti)), tantalum (Ta)), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

The gate spacer 140 may be disposed on a sidewall of the gate electrode 120. The gate spacer 140 may be extended in the second direction D2. The gate spacer 140 may include, for example, at least one of silicon nitride (SiN), silicon oxynitride (SiON), silicon oxide (SiO$_2$), silicon oxycarbonitride (SiOCN), silicon boron nitride (SiBN), silicon boron oxynitride (SiOBN), silicon oxycarbide (SiOC), or combinations thereof.

The gate insulating film 130 may be extended along a sidewall and a bottom surface of the gate electrode 120. The gate insulating film 130 may be formed on the active pattern AP and the field insulating film 105. The gate insulating film 130 may be formed between the gate electrode 120 and the gate spacer 140.

The gate insulating film 130 may include a high dielectric constant material having a dielectric constant greater than that of silicon oxide, silicon oxynitride, or silicon nitride. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments may include a negative capacitance (NC) FET using a negative capacitor. For example, the gate insulating film 130 may include a ferroelectric material film having ferroelectric characteristics and a paraelectric material film having paraelectric characteristics.

The ferroelectric material film may have a negative capacitance and the paraelectric material film may have a positive capacitance. For example, when two or more capacitors are connected in series and the capacitance of each capacitor has a positive value, the total capacitance is reduced as compared to the capacitance of each individual capacitor. On the other hand, when at least one of the capacitances of two or more capacitors connected in series has a negative value, the total capacitance may have a positive value and may be greater than an absolute value of each individual capacitance.

When a ferroelectric material film having a negative capacitance and a paraelectric material film having a positive capacitance are connected in series, the total capacitance value of the ferroelectric material film and the paraelectric material film, which are connected in series, may be increased. Given that the total capacitance value is increased, the transistor including the ferroelectric material film may have a subthreshold swing less than 60 mV/decade at room temperature.

The ferroelectric material film may have ferroelectric characteristics. The ferroelectric material film may include at least one of hafnium oxide, hafnium zirconium oxide, barium strontium titanium oxide, barium titanium oxide, or lead zirconium titanium oxide. In one embodiment, hafnium zirconium oxide may be a material doped with zirconium (Zr) on hafnium oxide. In another embodiment, hafnium zirconium oxide may be a compound of hafnium (Hf), zirconium (Zr) and oxygen (O).

The ferroelectric material film may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of the dopant included in the ferroelectric material film may vary depending on a ferroelectric material included in the ferroelectric material film.

When the ferroelectric material film includes hafnium oxide, the dopant included in the ferroelectric material film may include at least one of gadolinium (Gd), silicon (Si), zirconium (Zr), aluminum (Al), or yttrium (Y).

When the dopant is aluminum (Al), the ferroelectric material film may include aluminum of 3 atomic % (at %) to 8 at %. In this case, a ratio of the dopant may be a ratio of aluminum to a sum of hafnium and aluminum.

When the dopant is silicon (Si), the ferroelectric material film may include silicon of 2 at % to 10 at %. When the dopant is yttrium (Y), the ferroelectric material film may comprise yttrium of 2 at % to 10 at %. When the dopant is gadolinium (Gd), the ferroelectric material film may include gadolinium of 1 at % to 7 at %. When the dopant is zirconium (Zr), the ferroelectric material film may include zirconium of 50 at % to 80 at %.

The paraelectric material film may have paraelectric characteristics. The paraelectric material film may include, for example, at least one of a silicon oxide or a metal oxide having a high dielectric constant. The metal oxide included in the paraelectric material film may include, but is not limited to, at least one of hafnium oxide, zirconium oxide, or aluminum oxide.

The ferroelectric material film and the paraelectric material film may include the same material. Although the ferroelectric material film has ferroelectric characteristics, the paraelectric material film may not have ferroelectric characteristics. For example, when the ferroelectric material film and the paraelectric material film include hafnium oxide, a crystal structure of the hafnium oxide included in the ferroelectric material film is different from that of the hafnium oxide included in the paraelectric material film.

The ferroelectric material film may have a thickness having ferroelectric characteristics. The thickness of the ferroelectric material film may be, for example, 0.5 nm to 10 nm, but is not limited thereto. Since a threshold thickness indicating ferroelectric characteristics may vary depending on each ferroelectric material, the thickness of the ferroelectric material film may vary depending on the ferroelectric material.

In an embodiment, the gate insulating film 130 may include one ferroelectric material film. In another embodiment, the gate insulating film 130 may include a plurality of ferroelectric material films spaced apart from each other. The gate insulating film 130 may have a deposited film structure in which a plurality of ferroelectric material films and a plurality of paraelectric material films are alternately deposited.

The gate capping pattern 150 may be disposed on an upper surface of the gate electrode and an upper surface of the gate spacer 140. The gate capping pattern 150 may include, for example, at least one of silicon nitride (SiN), silicon oxynitride (SiON), silicon oxide (SiO$_2$), silicon carbonitride (SiCN), silicon oxycarbonitride (SiOCN), or combinations thereof.

A source/drain pattern 170 may be formed on the active pattern AP. The source/drain pattern 170 may be positioned on the second substrate 100. The source/drain pattern 170 may be disposed on a side surface of the gate structure GS. The source/drain pattern 170 may be disposed between adjacent gate structures GS.

The source/drain pattern 170 may include an epitaxial pattern. That is, the source/drain pattern 170 may be included in a source/drain region of the transistor that uses the active pattern AP as the channel region.

A passivation film 176 covering a sidewall of the gate structure GS, an upper surface and a sidewall of the source/ drain pattern 170 and an upper surface of the field insulating film 105 may be formed. For example, the passivation film 176 may include a material having an etch selectivity with respect to a first interlayer insulating film 190 that will be described later. For example, the passivation film 176 may include at least one of silicon nitride (SiN), silicon oxynitride (SiON), silicon oxycarbonitride (SiOCN), silicon boron nitride (SiBN), silicon boron oxynitride (SiOBN), silicon oxycarbide (SiOC), or combinations thereof.

The first interlayer insulating film 190 may be formed on the passivation film 176. The first interlayer insulating film 190 may be formed on the source/drain pattern 170. The first interlayer insulating film 190 may be formed between the gate structures GS. The first interlayer insulating film 190 may include, but is not limited to, silicon oxide.

Figure 17:
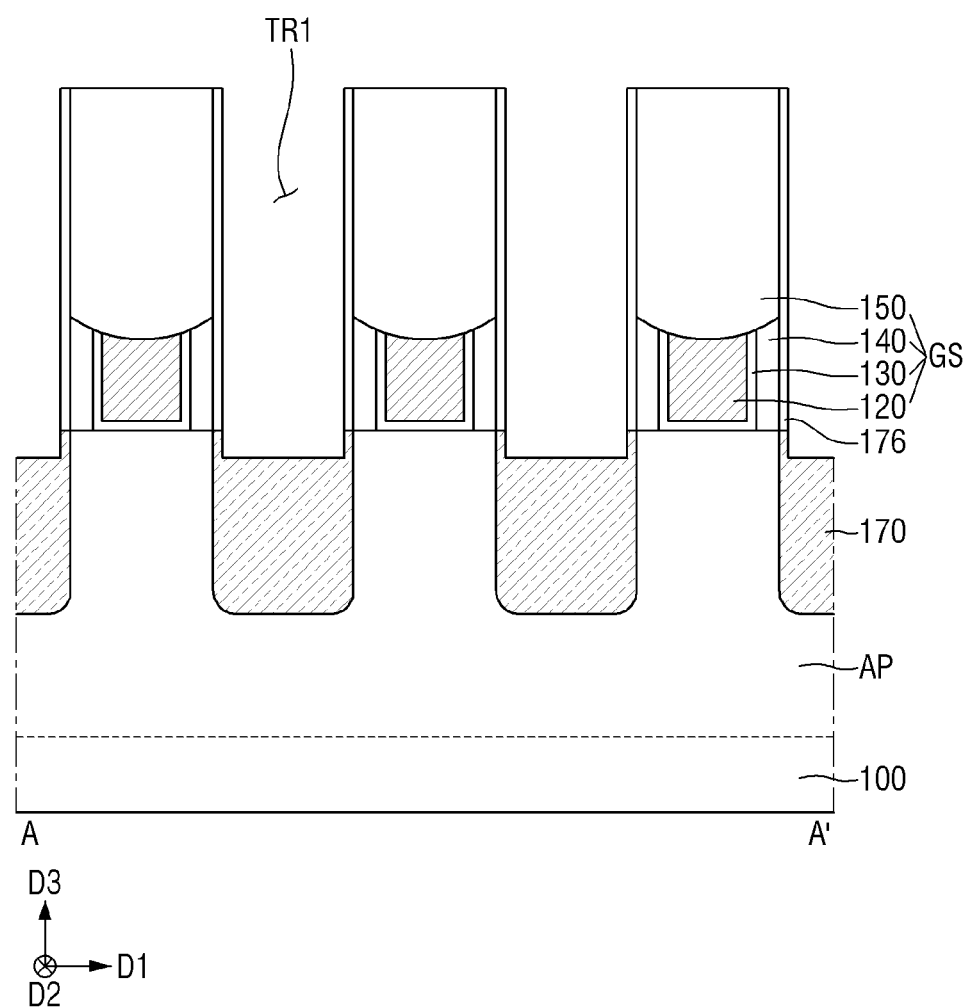
Figure 18:
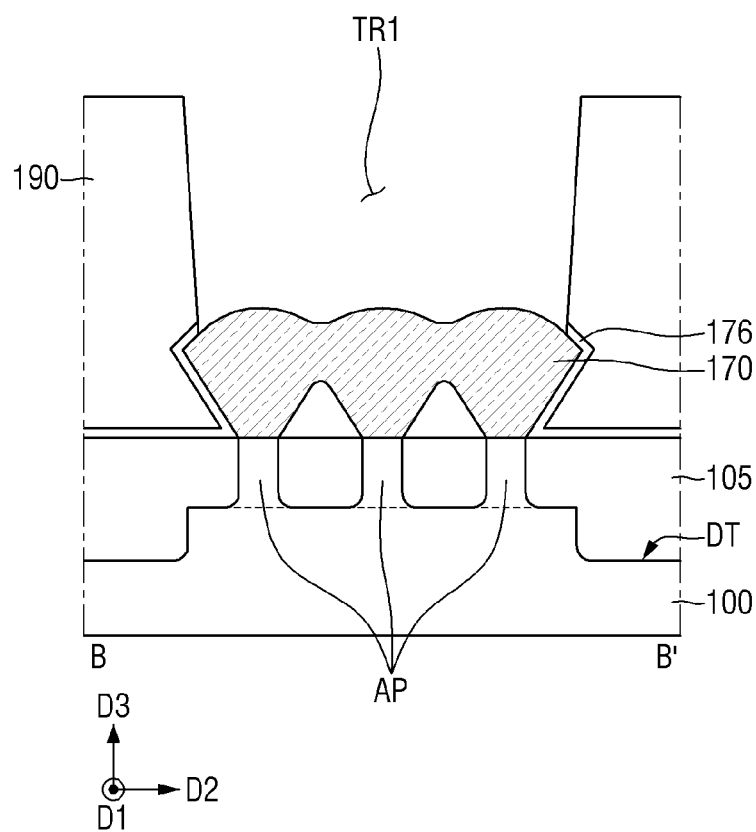

Referring to FIGS. 17 and 18, a first trench TR1 may be formed by removing a portion of the first interlayer insulating film 190.

The first trench TR1 may expose the source/drain pattern 170 by passing through the passivation film 176. In some embodiments, in the process of forming the first trench TR1, the passivation film 176 on the sidewall of the gate structure GS is not etched. In other embodiments, in the process of forming the first trench TR1, the passivation film 176 on the sidewall of the gate structure GS may also be removed.

Figure 19:
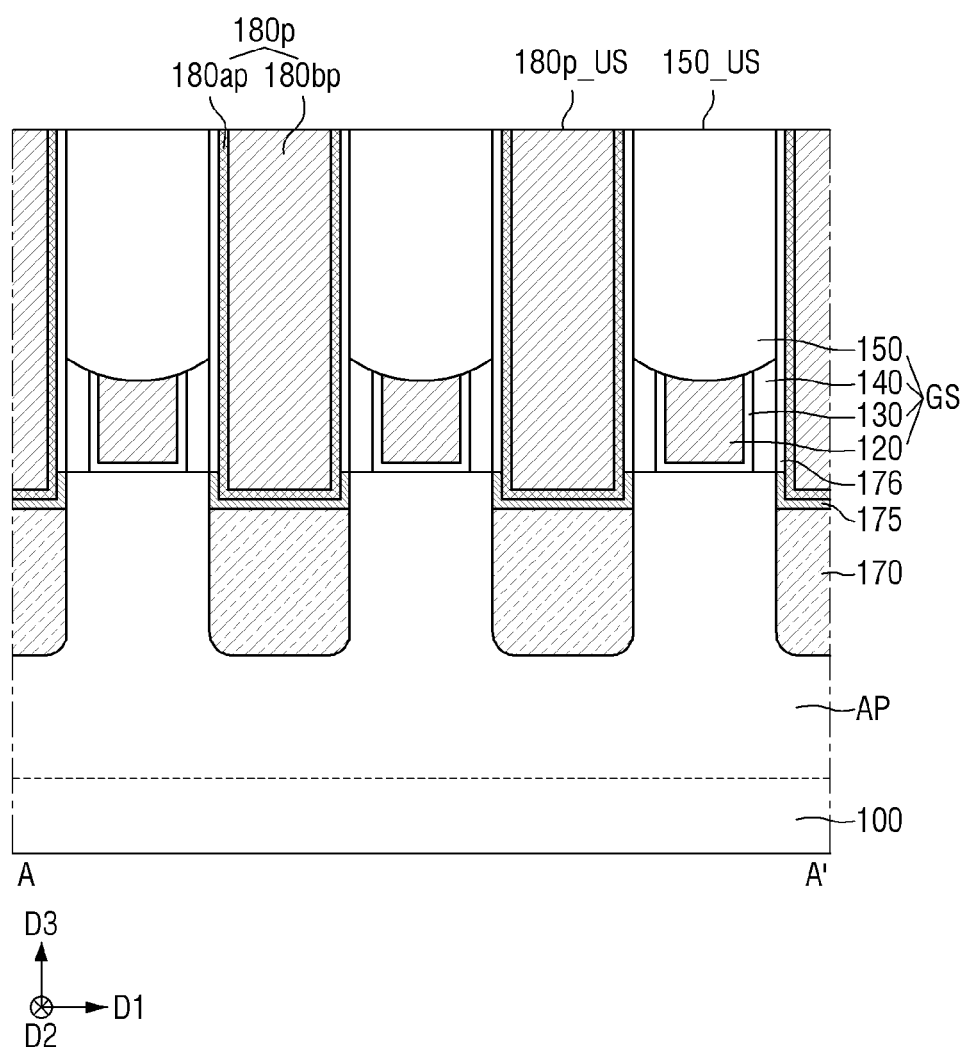
Figure 20:
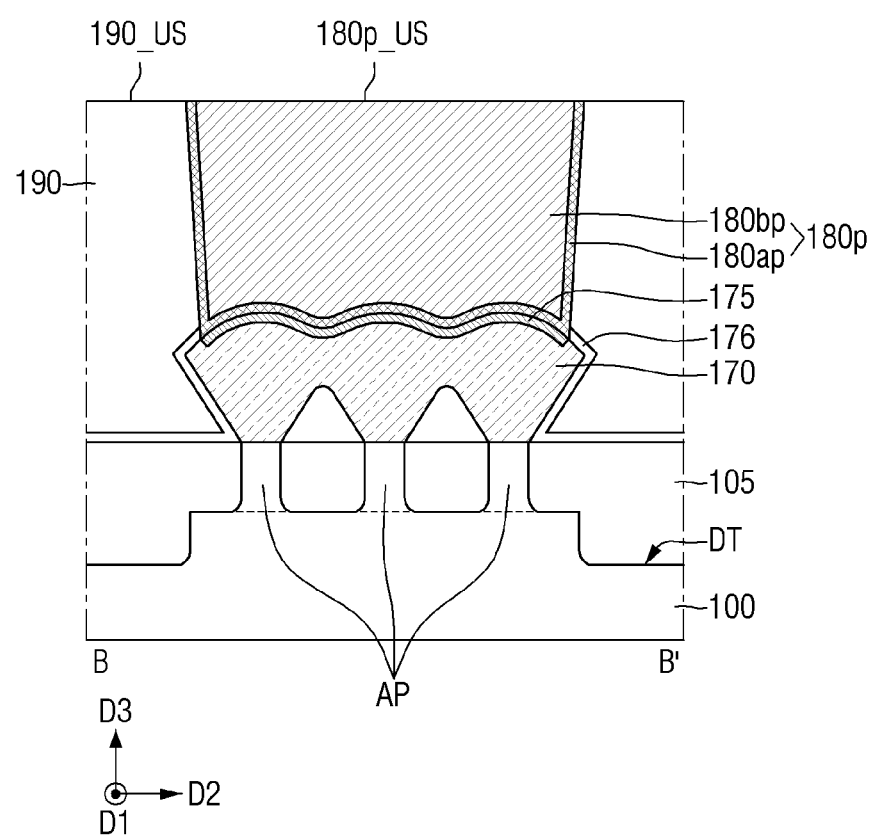

Referring to FIGS. 19 and 20, a pre-first active contact 180p filling the first trench TR1 may be formed.

An upper surface 180p_US of the pre-first active contact 180p may be positioned on or at the same plane as an upper surface 190_US of the first interlayer insulating film 190 and an upper surface 150_US of the gate capping pattern 150. The pre-first active contact 180p may be connected with the source/drain pattern 170.

The pre-first active contact 180p may be formed of a multi-film. The pre-first active contact 180p may include, for example, a pre-first active contact barrier film 180ap and a pre-first active contact filling film 180bp. The pre-first active contact filling film 180bp may be disposed on the pre-first active contact barrier film 180ap. The pre-first active contact barrier film 180ap may be extended along a sidewall and a bottom surface of the pre-first active contact filling film 180bp.

The pre-first active contact barrier film 180ap may include, for example, at least one of tantalum (Ta)), tantalum nitride (TaN), titanium (Ti)) titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or two-dimensional (2D) material.

The pre-first active contact filling film 180bp may include, for example, at least one of iridium (Ir), ruthenium (Ru), rhodium (Rh), molybdenum (Mo), copper (Cu), antimony (Sb), aluminum (Al), titanium (Ti), nickel (Ni), tantalum (Ta), zirconium (Zr), hafnium (Hf), tungsten (W), or cobalt (Co).

A silicide film 175 may be formed at a portion where the pre-first active contact 180p and the source/drain pattern 170 are in contact with each other. The silicide film 175 may include, for example, a metal silicide material.

Figure 21:
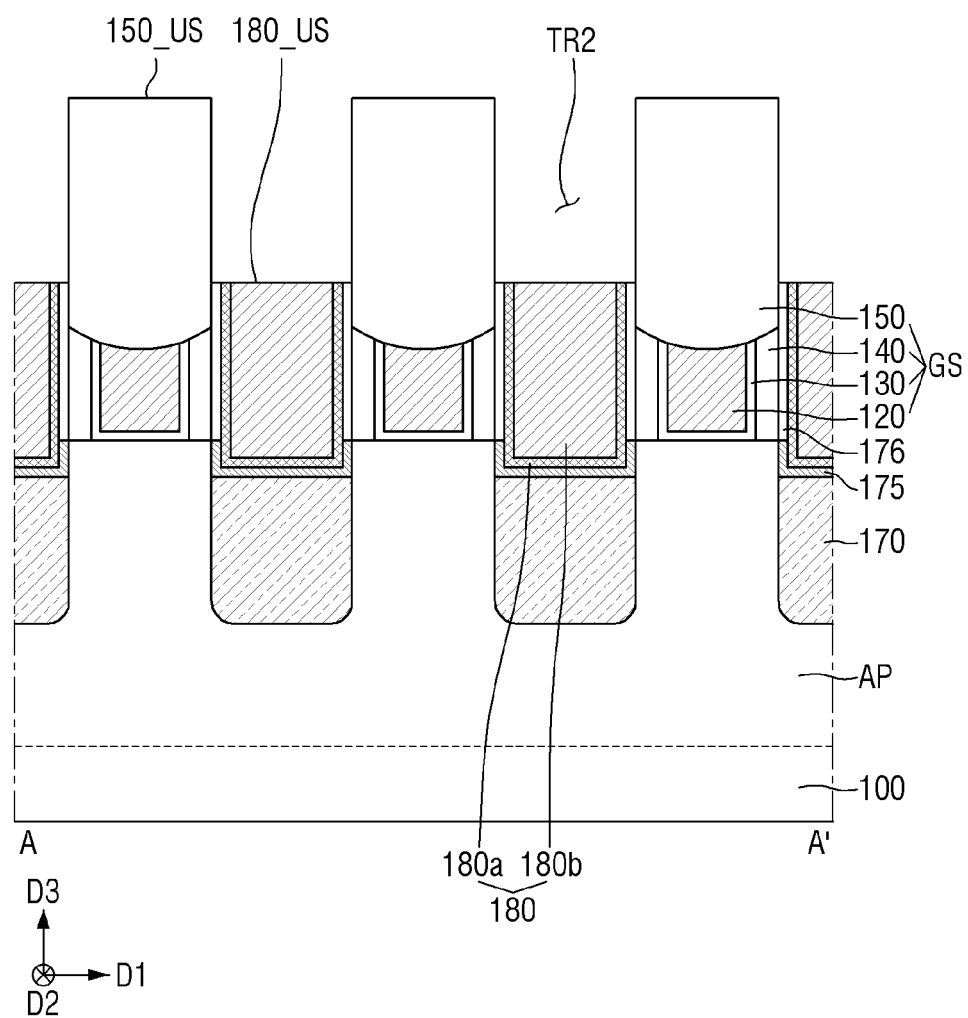
Figure 22:
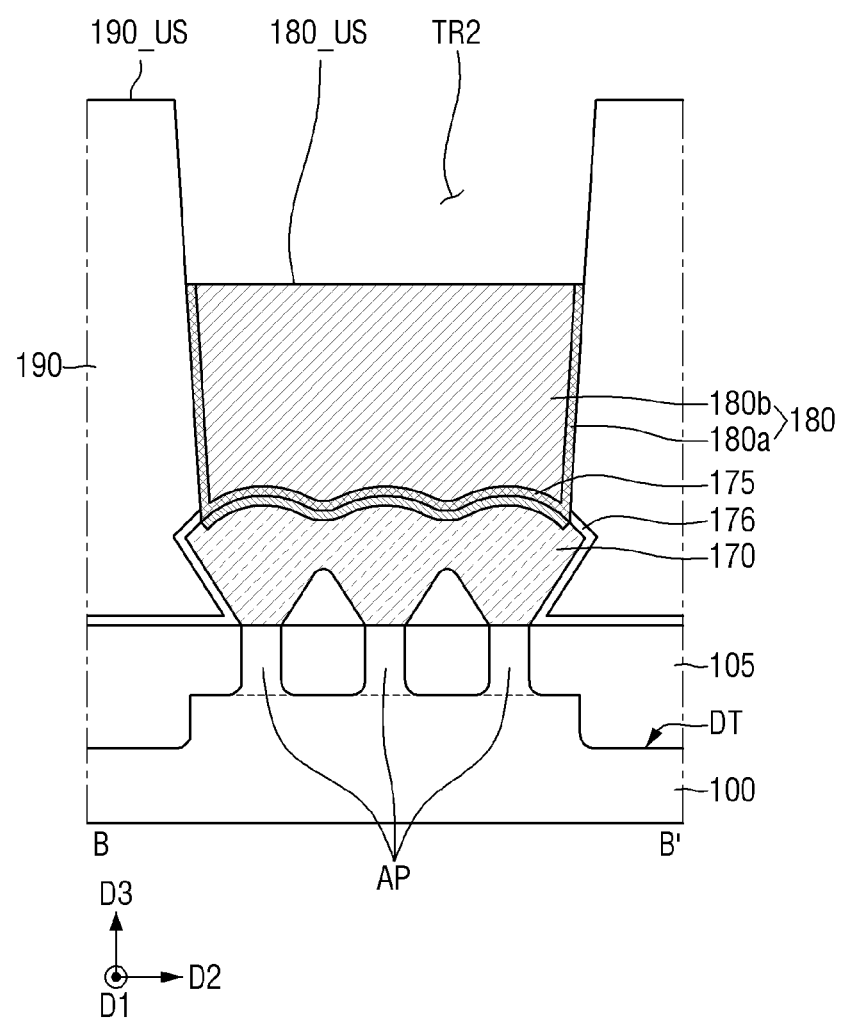

Referring to FIGS. 21 and 22, a portion of the pre-first active contact 180p may be etched to form a first active contact 180.

A portion of the pre-first active contact 180p may be etched to form a second trench TR2 that exposes an upper surface 180_US of the first active contact 180.

The upper surface 180_US of the first active contact 180 may be lower than the upper surface 150_US of the gate capping pattern 150. The upper surface 180_US of the first active contact 180 may be lower than the upper surface 190_US of the first interlayer insulating film 190. The upper surface 180_US of the first active contact 180 is formed to be higher than the upper surface of the gate electrode 120 as shown, but is not limited thereto. In other embodiments, the upper surface 180_US of the first active contact 180 may be formed to be lower than the upper surface of the gate electrode 120. In still further embodiments, the upper surface 180_US of the first active contact 180 may be formed on the same plane as the upper surface of the gate electrode 120.

The pre-first active contact 180p may be etched using the atomic layer etching method described with reference to FIGS. 1 to 13.

For example, when a distance from the upper surface 180_US of the first active contact 180 to the upper surface 150_US of the gate capping pattern 150 is desired to be the first distance (D1 of FIG. 6), the etching cycle may be performed once to etch the pre-first active contact 180p.

For example, when a distance from the upper surface 180_US of the first active contact 180 to the upper surface 150_US of the gate capping pattern 150 is desired to be the second distance (D2 of FIG. 7), the etching cycle may be performed twice to etch the pre-first active contact 180p.

That is, the number of times that the etching cycle is performed may be controlled depending on an etched level of the pre-first active contact 180p.

Figure 23:
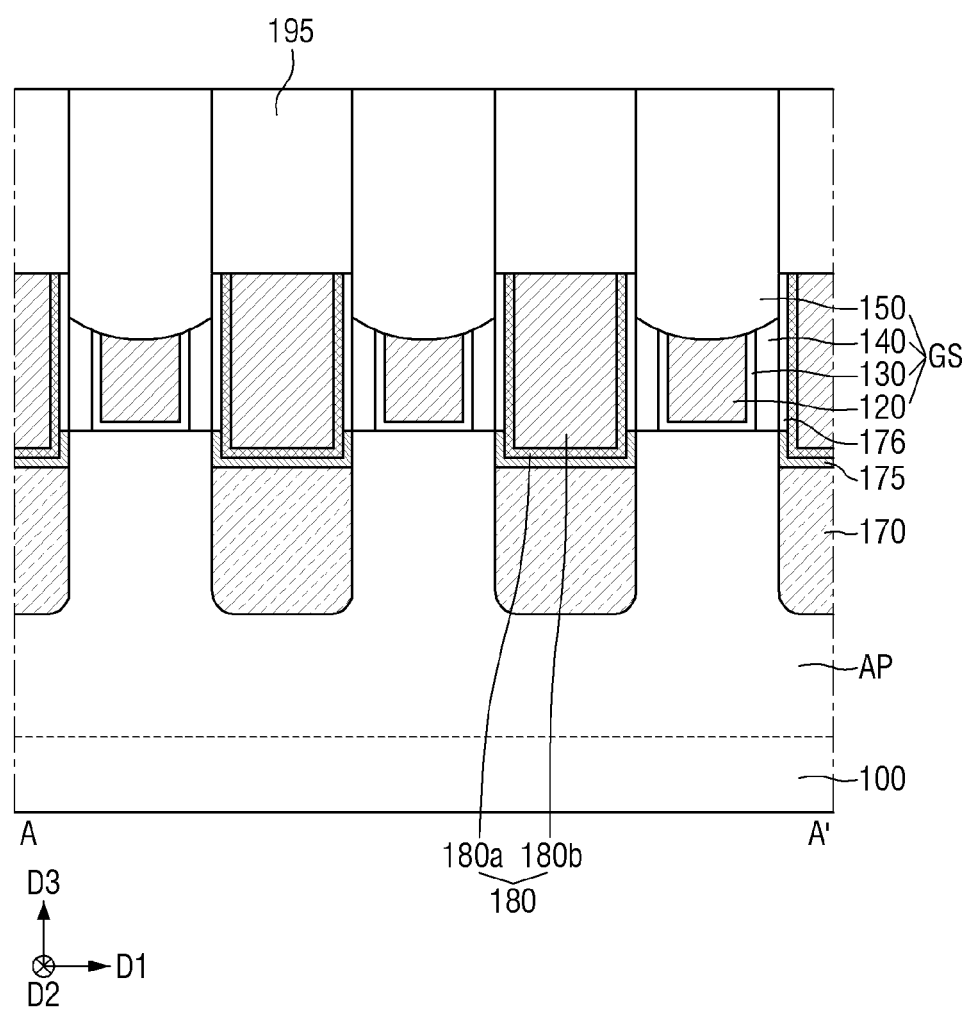
Figure 24:
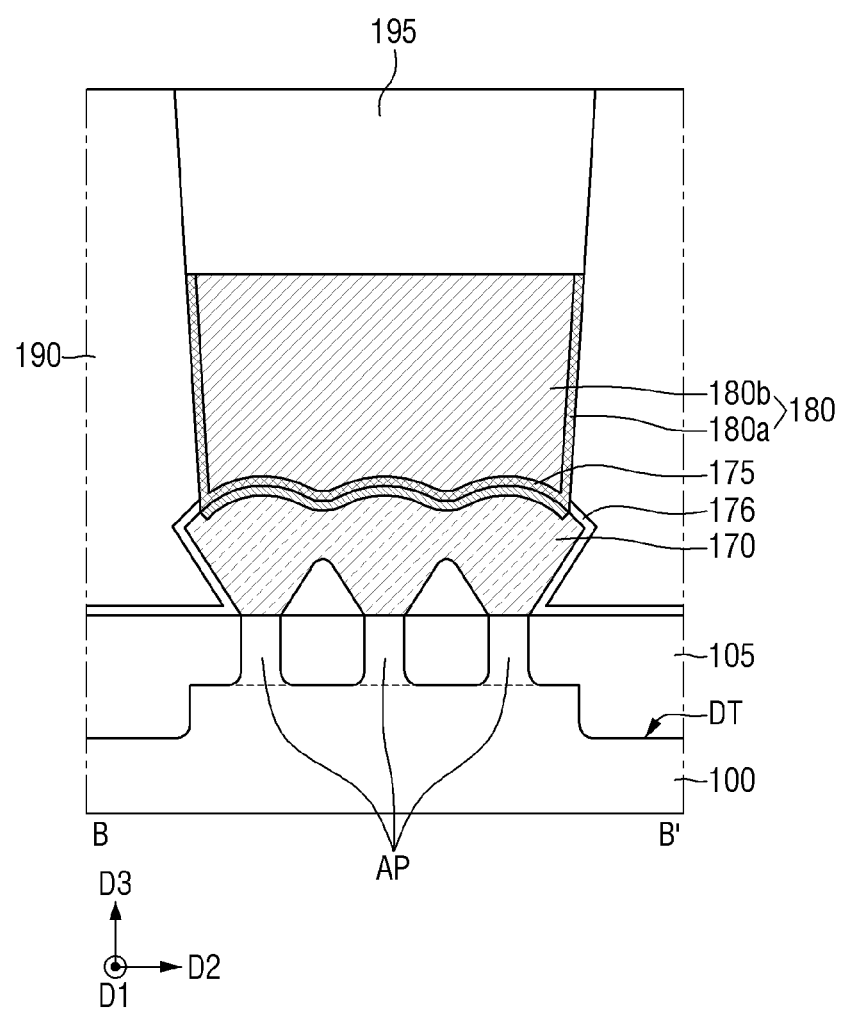

Referring to FIGS. 23 and 24, a second interlayer insulating film 195 may be formed to fill the second trench TR2.

The second interlayer insulating film 195 may fill between adjacent gate structures GS. The second interlayer insulating film 195 may be formed to be adjacent to the first interlayer insulating film 190. The second interlayer insulating film 195 may include, but is not limited to, silicon oxide.

Figure 25:
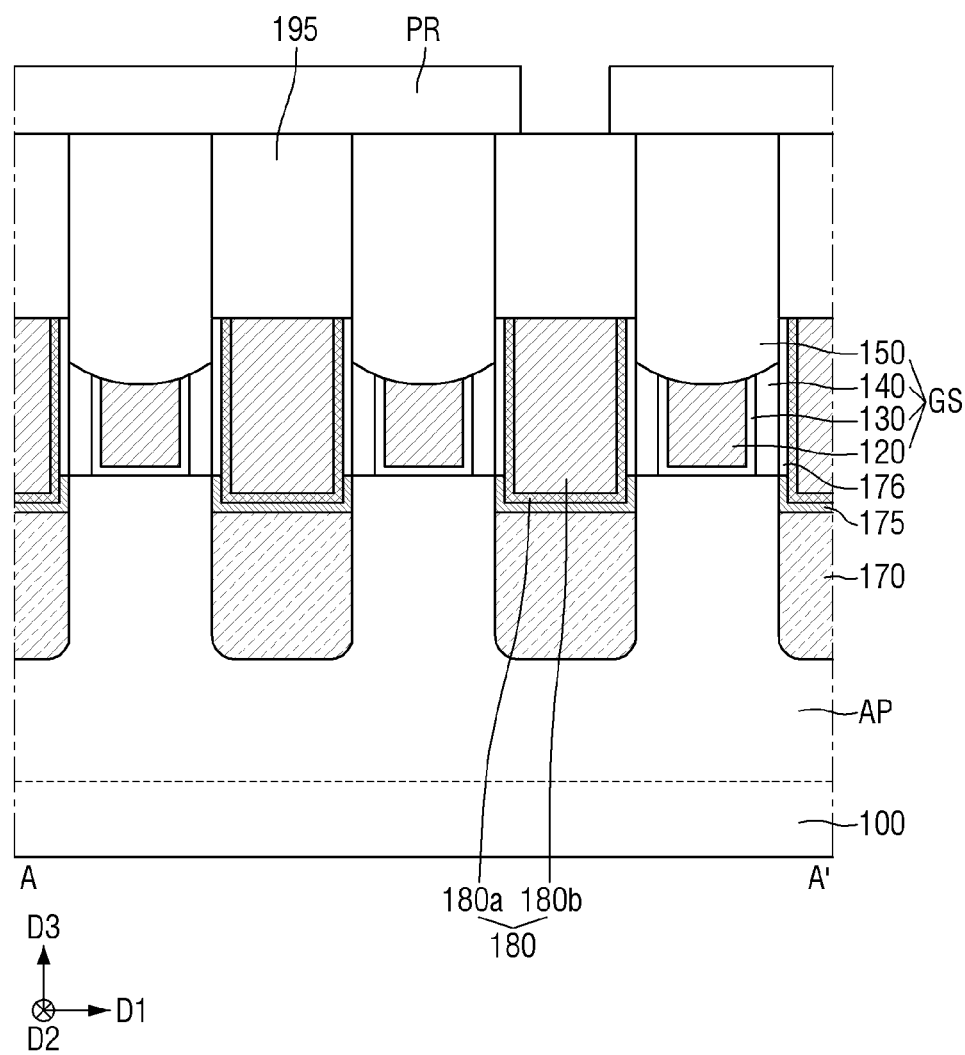
Figure 26:
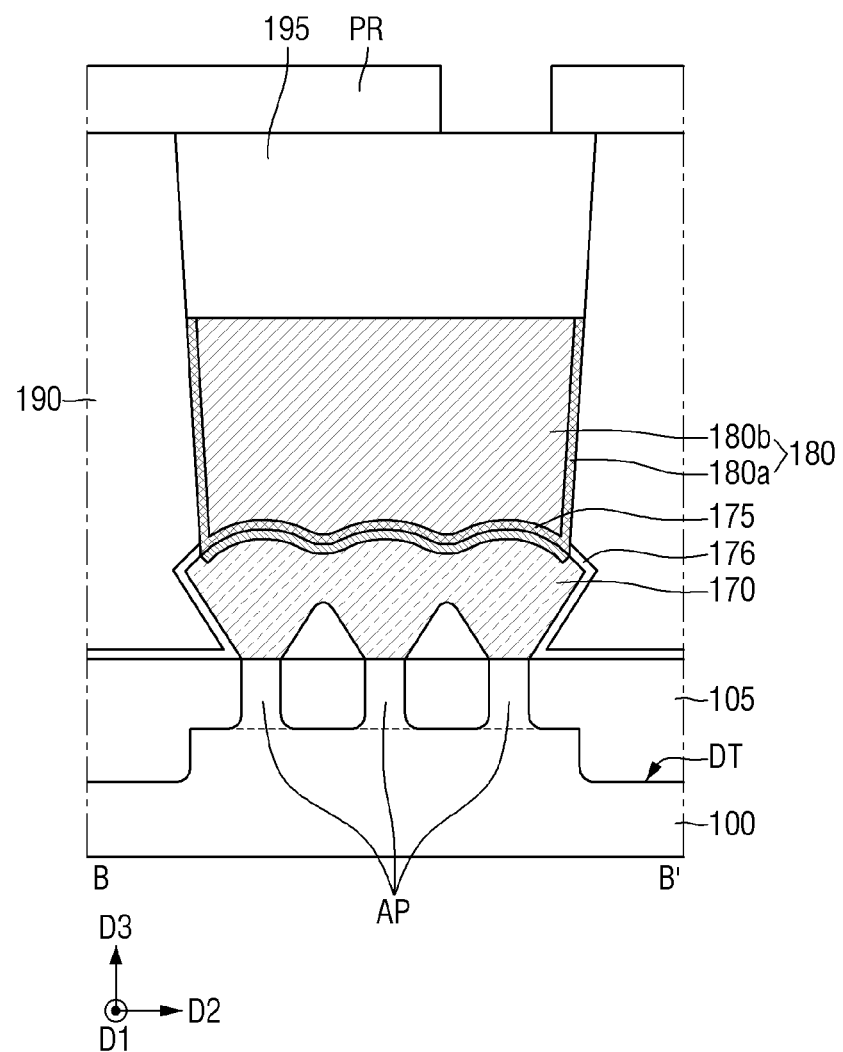

Referring to FIGS. 25 and 26, a photoresist film PR may be formed on the first interlayer insulating film 190, the second interlayer insulating film 195, and the gate capping pattern 150.

For example, the photoresist film PR may be used as a mask for forming a second active contact 185, which will be described later.

Figure 27:
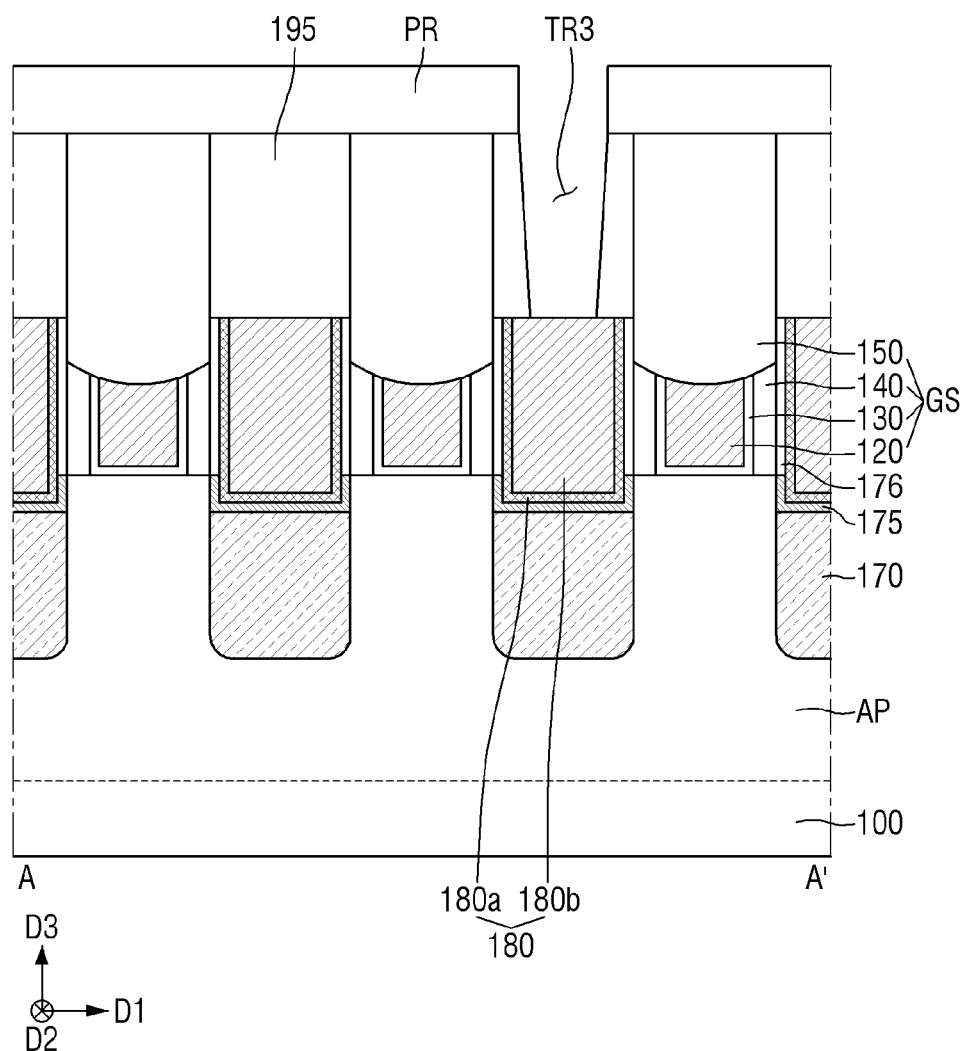
Figure 28:
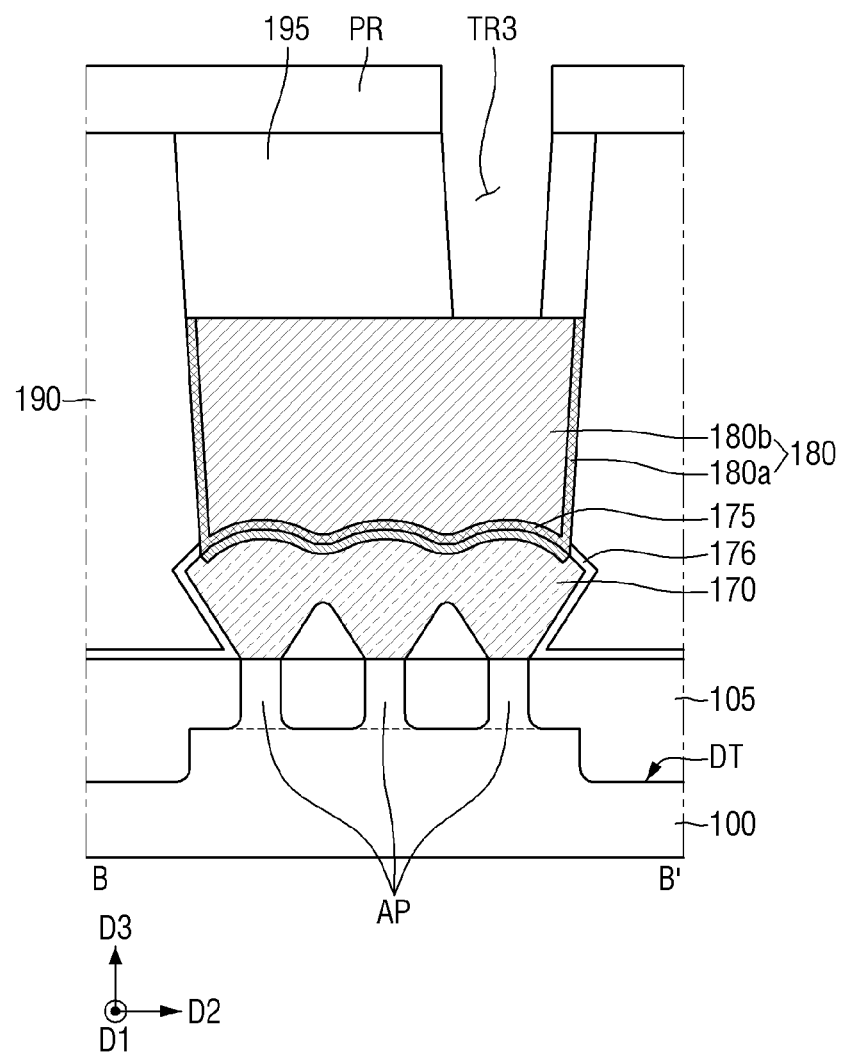

Referring to FIGS. 27 and 28, a third trench TR3 passing through the second interlayer insulating film 195 may be formed using the photoresist film PR pattern as a mask.

The third trench TR3 may expose an upper surface of the first active contact 180.

Figure 29:
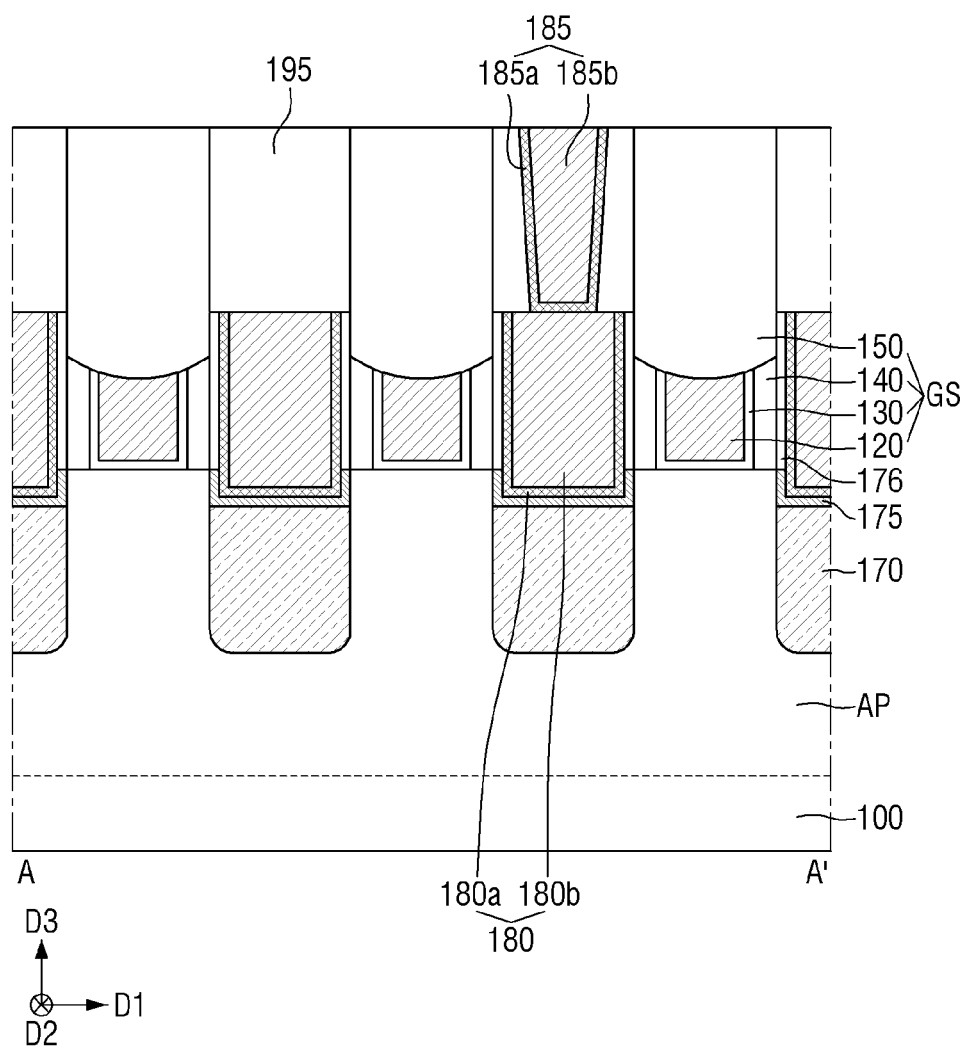
Figure 30:
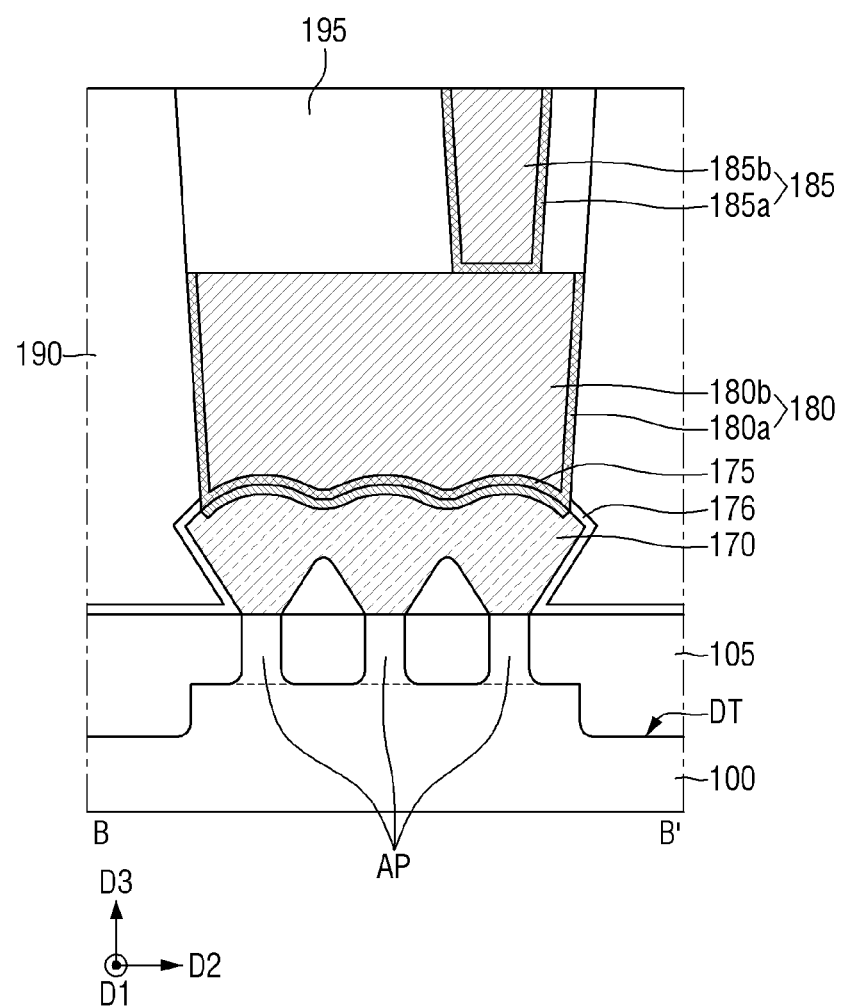

Referring to FIGS. 29 and 30, the second active contact 185 may be formed to fill the third trench TR3. The photoresist film PR may be removed.

The second active contact 185 may be formed on the first active contact 180. The second active contact 185 may be connected with the first active contact 180.

The second active contact 185 may be formed of a multi-film. The second active contact 185 may include, for example, a second active contact barrier film 185a and a second active contact filling film 185b. The second active contact filling film 185b may be disposed on the second active contact barrier film 185a. The second active contact barrier film 185a may be disposed along a bottom surface and a sidewall of the second active contact filling film 185b.

Material included in each of the second active contact barrier film 185a and the second active contact filling film 185b may respectively be the same as the material included in each of the first active contact barrier film 180a and the first active contact filling film 180b.

Figure 31:
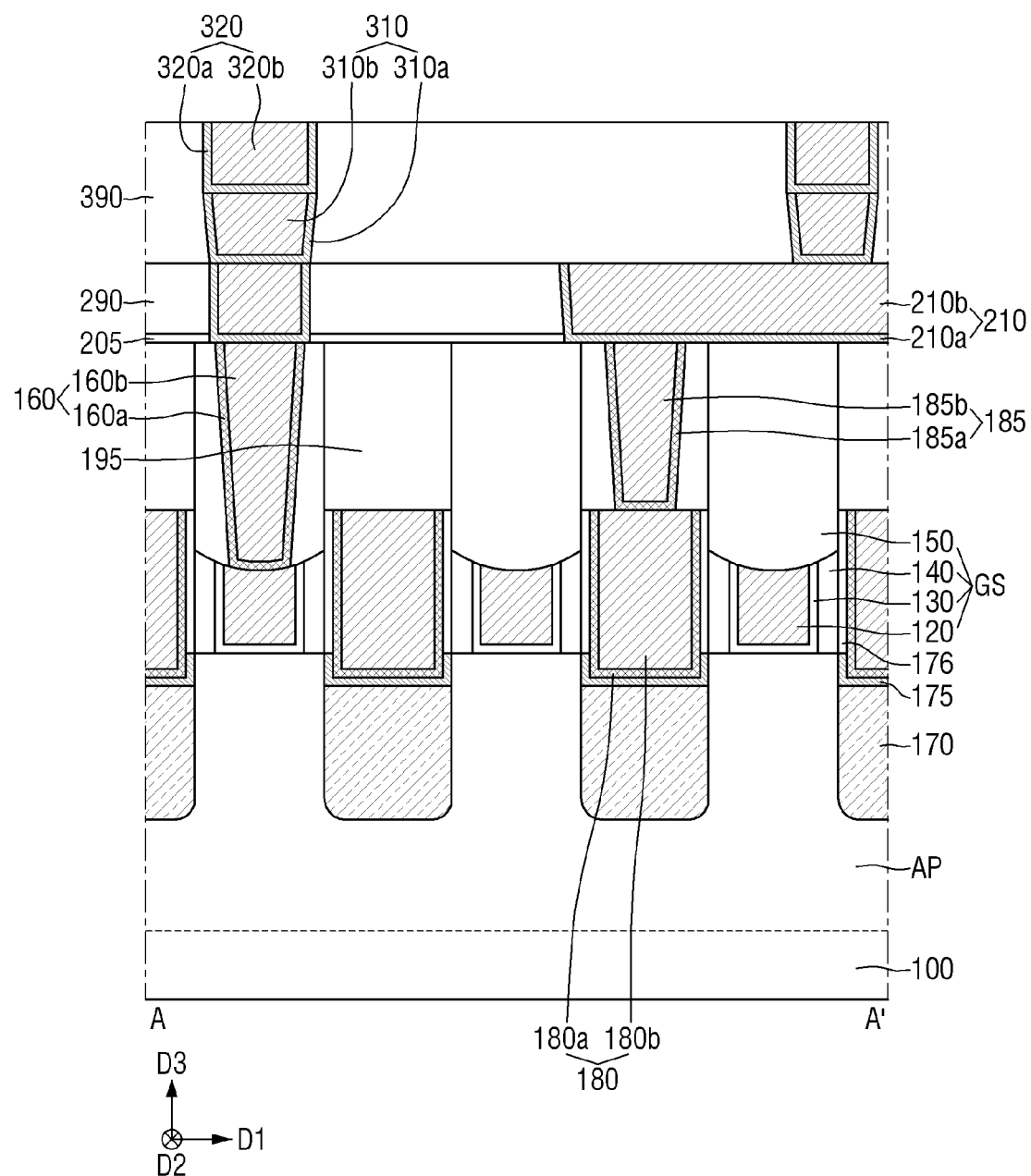
Figure 32:
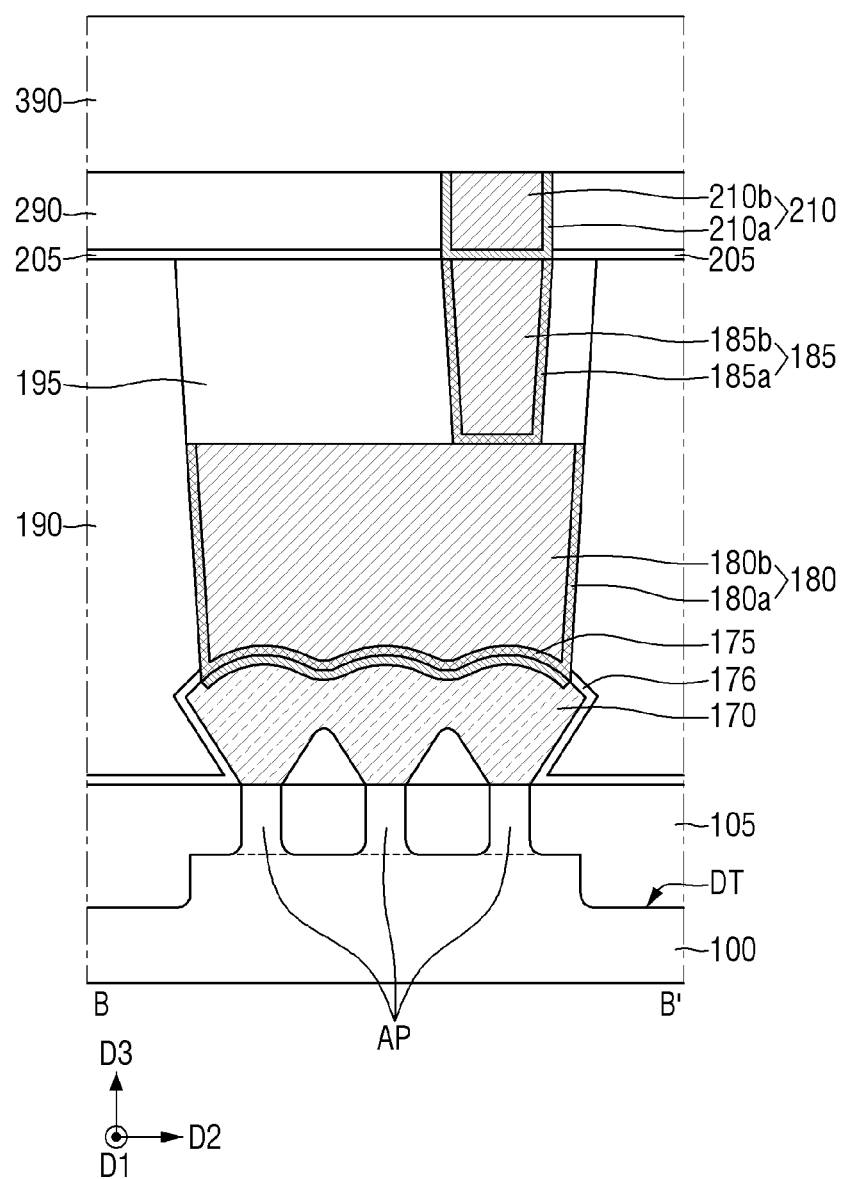

Referring to FIGS. 31 and 32, a gate contact 160 connected with the gate electrode 120 may be formed by passing through the gate capping pattern 150.

The gate contact 160 may be formed by passing through the gate capping pattern 150 in the third direction D3. The gate contact 160 may be formed of a multi-film. The gate contact 160 may include, for example, a gate contact barrier film 160a and a gate contact filling film 160b. The gate contact filling film 160b may be disposed on the gate contact barrier film 160a. The gate contact barrier film 160a may be disposed along a sidewall and a bottom surface of the gate contact filling film 160b.

Material included in each of the gate contact barrier film 160a and the gate contact filling film 160b may respectively be the same as the material included in each of the first active contact barrier film 180a and the first active contact filling film 180b.

Subsequently, a wiring etch stop film 205 may be formed on the first interlayer insulating film 190, the second interlayer insulating film 195, and the gate capping pattern 150.

The wiring etch stop film 205 may be formed to be extended along the upper surface of the first interlayer insulating film 190, the upper surface of the second interlayer insulating film 195, and the upper surface of the gate capping pattern 150. For example, the wiring etch stop film 205 may include a material having an etch selectivity with respect to a third interlayer insulating film 290, which will be described later. The wiring etch stop film 205 may include, for example, at least one of silicon nitride (SiN), silicon oxynitride (SiON), silicon oxycarbonitride (SiOCN), silicon boron nitride (SiBN), silicon boron oxynitride (SiOBN), silicon oxycarbide (SiOC), aluminum oxide (AlO), aluminum nitride (AlN), aluminum oxycarbide (AlOC), or combinations thereof.

Subsequently, the third interlayer insulating film 290 may be formed on the wiring etch stop film 205. The third interlayer insulating film 290 may include, for example, at least one of silicon oxide, silicon nitride, silicon oxynitride, or a low dielectric constant material.

Subsequently, a first wiring pattern 210 passing through the third interlayer insulating film 290 and the wiring etch stop film 205 may be formed. The first wiring pattern 210 may be connected with the gate contact 160 and the second active contact 185.

The first wiring pattern 210 may have a multi-conductive film structure. The first wiring pattern 210 may include, for example, a first wiring barrier film 210a and a first wiring filling film 210b. The first wiring filling film 210b may be disposed on the first wiring barrier film 210a. The first wiring barrier film 210a may be disposed along a sidewall and a bottom surface of the first wiring filling film 210b.

Subsequently, a fourth interlayer insulating film 390 may be formed on the third interlayer insulating film 290. The fourth interlayer insulating film 390 may include, for example, at least one of silicon oxide, silicon nitride, silicon oxynitride, or a low dielectric constant material.

Subsequently, a via structure 310 and a second wiring pattern 320 may sequentially be formed in the fourth interlayer insulating film 390.

The via structure 310 may be formed on the first wiring pattern 210. The via structure 310 may be connected with the first wiring pattern 210. The via structure 310 may be a multi-film that includes a via barrier film 310a and a via filling film 310b. The via filling film 310b may be disposed on the via barrier film 310a. The via barrier film 310a may be disposed along a sidewall and a bottom surface of the via filling film 310b.

The via barrier film 310a may include, for example, at least one of tantalum (Ta)), tantalum nitride (TaN), titanium (Ti)) titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or two-dimensional (2D) material.

The via filling film 310b may include, for example, at least one of aluminum (Al), copper (Cu), tungsten (W), cobalt (Co), ruthenium (Ru), silver (Ag), gold (Au), manganese (Mn), or molybdenum (Mo).

The second wiring pattern 320 may be disposed on the via structure 310. The second wiring pattern 320 may be a multi-film that includes a second wiring barrier film 320a and a second wiring filling film 320b.

The second wiring filling film 320b may be disposed on the second wiring barrier film 320a. The second wiring barrier film 320a may be disposed along a sidewall and a bottom surface of the second wiring filling film 320b. Material included in each of the second wiring barrier film 320a and the second wiring filling film 320b may be respectively the same as the material included in each of the first wiring barrier film 210a and the first wiring filling film 310b.

Although not shown, the pre-first active contact 180p overlapped with the first wiring pattern 210 in the third direction Z may not be etched, unlike FIGS. 21 and 22. In this case, a mask pattern may be formed in a region overlapped with the first wiring pattern 210 in the third direction Z.

In concluding the detailed description, those skilled in the art will appreciate that many variations and modifications may be made to the preferred embodiments without substantially departing from the inventive concepts. Therefore, the disclosed preferred embodiments of the disclosure are used in a generic and descriptive sense only and not for purposes of limitation.

What is claimed is:
1. An atomic layer etching method comprising:
forming a metal layer on a substrate; and
etching at least a portion of the metal layer,
wherein the etching at least the portion of the metal layer includes at least one etching cycle,
the at least one etching cycle includes supplying an active gas onto the metal layer, and supplying an etching support gas after the supplying the active gas, and
the etching support gas is pentamethyldiethylenetriamine (PMDETA) expressed by the following formula

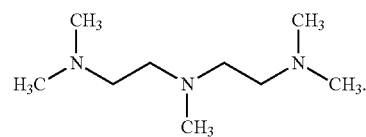

wherein H is hydrogen, C is carbon, and N is nitrogen.
2. The atomic layer etching method of claim 1, wherein the metal layer includes at least one of iridium (Ir), ruthenium (Ru), rhodium (Rh), molybdenum (Mo), copper (Cu), antimony (Sb), aluminum (Al), titanium (Ti), nickel (Ni), tantalum (Ta), zirconium (Zr), hafnium (Hf), tungsten (W), or cobalt (Co).

3. The atomic layer etching method of claim 1, wherein a temperature of the substrate is in a range from 150° C. to 200° C.

4. The atomic layer etching method of claim 1, wherein the active gas includes at least one of fluorine ($F_2$), chlorine ($Cl_2$), bromine ($Br_2$), iodine ($I_2$) $C_{1-7}$ alkyl halide, or tri $C_{1-7}$ alkyl silyl halide.

5. The atomic layer etching method of claim 1, further comprising performing a pre-treatment process that reduces a surface of the metal layer, before the supplying the active gas, wherein the performing the pre-treatment process includes supplying a reducing gas.

6. The atomic layer etching method of claim 5, wherein the reducing gas includes at least one of hydrogen ($H_2$), ammonia ($NH_3$), silane ($SiH_4$), borane ($BH_3$), diborane ($B_2H_6$), phosphine ($PH_3$), or hydrazine ($N_2H_4$).

7. The atomic layer etching method of claim 5, further comprising removing residual reducing gas after the performing the pre-treatment process.

8. The atomic layer etching method of claim 1, further comprising removing residual active gas before the supplying the etching support gas, and
removing residual etching support gas after the supplying the etching support gas.

9. The atomic layer etching method of claim 1, further comprising forming an insulating layer on the substrate,
wherein the active gas and the etching support gas do not react with the insulating layer.

10. The atomic layer etching method of claim 1, wherein the supplying the active gas includes activating a surface of the metal layer, and
the supplying the etching support gas includes forming a coordinated complex between an activated surface of the metal layer and the etching support gas.

11. An atomic layer etching method comprising:
forming a metal layer on a substrate; and
etching at least a portion of the metal layer,
wherein the etching at least the portion of the metal layer includes at least one etching cycle,
the at least one etching cycle includes supplying an active gas including a halogen gas onto the metal layer, and supplying an amine based etching support gas after the supplying the active gas, and
the supplying the etching support gas includes supplying the etching support gas at a feeding dosage of 50 Tory sec to 70 Tory sec,
the etching support gas is pentamethyldiethylenetriamine (PMDETA) expressed by the following formula

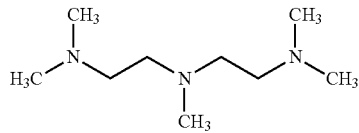

wherein H is hydrogen, C is carbon, and N is nitrogen.

12. The atomic layer etching method of claim 11, wherein the metal layer includes at least one of iridium (Ir), ruthenium (Ru), rhodium (Rh), molybdenum (Mo), copper (Cu), antimony (Sb), aluminum (Al), titanium (Ti), nickel (Ni), tantalum (Ta), zirconium (Zr), hafnium (Hf), tungsten (W), or cobalt (Co).

13. The atomic layer etching method of claim 11, wherein the active gas includes at least one of fluorine ($F_2$), chlorine ($Cl_2$), bromine ($Br_2$), iodine ($I_2$), $C_{1-7}$ alkyl halide, or tri $C_{1-7}$ alkyl silyl halide.

14. The atomic layer etching method of claim 11, further comprising performing a pre-treatment process that reduces a surface of the metal layer, before the supplying the active gas,
wherein the performing the pre-treatment process includes supplying a reducing gas.

15. The atomic layer etching method of claim 14, further comprising removing residual reducing gas before the supplying the active gas,
removing residual active gas after the supplying the etching support gas, and
removing residual etching support gas after the supplying the etching support gas.

16. The atomic layer etching method of claim 14, wherein the reducing gas includes at least one of hydrogen ($H_2$), ammonia ($NH_3$), silane ($SiH_4$), borane ($BH_3$), diborane ($B_2H_6$), phosphine ($PH_3$), or hydrazine ($N_2H_4$).

17. A semiconductor device manufacturing method comprising:
forming an active pattern on a substrate;
forming a source/drain pattern on the active pattern;
forming an interlayer insulating film on the source/drain pattern;
forming a pre-active contact connected with the source/drain pattern, in the interlayer insulating film; and
etching a portion of the pre-active contact,
wherein the etching the portion of the pre-active contact includes at least one etching cycle,
the at least one etching cycle includes supplying an active gas onto the pre-active contact, and supplying an etching support gas after supplying the active gas, and
the etching support gas is expressed by the following general formula

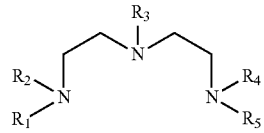

wherein each of R1, R2, R3, R4 and R5 independently includes hydrogen or a $C_1$-$C_4$ alkyl group, and N is nitrogen.

18. The semiconductor device manufacturing method of claim 17, wherein the supplying the etching support gas includes supplying the etching support gas at a feeding dosage of 50 Torr·sec to 70 Torr·sec.

19. The semiconductor device manufacturing method of claim 17, wherein the active gas and the etching support gas do not react with the interlayer insulating film.

* * * * *